United States Patent
Park et al.

(10) Patent No.: US 12,067,296 B2
(45) Date of Patent: *Aug. 20, 2024

(54) STORAGE DEVICE AND METHOD FOR ACCELERATING STORAGE DEVICE WRITE AND READ SPEED USING A TURBO-WRITE BUFFER

(71) Applicant: SAMSUNG ELECTRONICS CO., LTD., Suwon-si (KR)

(72) Inventors: Jeong-Woo Park, Hwaseong-si (KR); Dong-Min Kim, Hwaseong-si (KR); Youngmoon Kim, Suwon-si (KR); Kyoung Back Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/055,133

(22) Filed: Nov. 14, 2022

(65) Prior Publication Data

US 2023/0072721 A1    Mar. 9, 2023

Related U.S. Application Data

(63) Continuation of application No. 16/896,839, filed on Jun. 9, 2020, now Pat. No. 11,507,312.

(30) Foreign Application Priority Data

Aug. 1, 2019    (KR) .................... 10-2019-0094014

(51) Int. Cl.
*G06F 3/06*    (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0644; G06F 3/0679; G06F 3/061
See application file for complete search history.

(56) References Cited

U.S. PATENT DOCUMENTS

| | | | |
|---|---|---|---|
| 5,889,996 | A | 3/1999 | Adams |
| 6,470,424 | B1 | 10/2002 | Adams |
| 7,007,146 | B2 | 2/2006 | Romanufa et al. |
| 7,089,289 | B1 | 8/2006 | Blackmore et al. |

(Continued)

FOREIGN PATENT DOCUMENTS

| | | |
|---|---|---|
| CN | 109697026 A | 4/2019 |
| CN | 109840049 A | 6/2019 |

(Continued)

*Primary Examiner* — David Yi
*Assistant Examiner* — Nicholas A. Paperno
(74) *Attorney, Agent, or Firm* — F. CHAU & ASSOCIATES, LLC

(57) ABSTRACT

A storage device that includes a nonvolatile memory device is described. The storage device includes areas and a controller. The controller receives a write command and data from an external host device. The controller then preferentially writes the data in an area associated with a turbo write based on a turbo write policy, or in an area not associated with a turbo write based on a normal write policy. The controller also receives a move command from the external host device and moves data stored in the area to a different area based on the move command.

18 Claims, 25 Drawing Sheets

(56) References Cited

U.S. PATENT DOCUMENTS

| | | |
|---|---|---|
| 7,461,210 B1 | 12/2008 | Wentzlaff et al. |
| 7,620,773 B2 | 11/2009 | Nicholson et al. |
| 7,636,800 B2 | 12/2009 | Ben-Yehuda et al. |
| 8,060,719 B2 | 11/2011 | Radke et al. |
| 8,868,842 B2 | 10/2014 | Yano et al. |
| 8,886,877 B1 | 11/2014 | Avila et al. |
| 9,229,854 B1 | 1/2016 | Kuzmin et al. |
| 10,657,041 B2 | 5/2020 | Doh et al. |
| 10,996,883 B2 | 5/2021 | Kim et al. |
| 2009/0300269 A1 | 12/2009 | Radke et al. |
| 2010/0138596 A1 | 6/2010 | Hayashi |
| 2010/0207789 A1 | 8/2010 | Nieminen |
| 2013/0073839 A1* | 3/2013 | Hasegawa ........... G06F 12/0804 713/2 |
| 2013/0074136 A1 | 3/2013 | Chetlur et al. |
| 2014/0071753 A1 | 3/2014 | Shin |
| 2014/0215129 A1* | 7/2014 | Kuzmin ............. G06F 12/0246 711/103 |
| 2014/0293712 A1 | 10/2014 | Kim et al. |
| 2015/0268860 A1 | 9/2015 | Yum et al. |
| 2016/0034683 A1* | 2/2016 | Lee ....................... G06F 9/4408 726/17 |
| 2016/0141026 A1 | 5/2016 | Lee |
| 2016/0284393 A1 | 9/2016 | Ramalingam |
| 2019/0034088 A1 | 1/2019 | Li et al. |
| 2019/0056886 A1* | 2/2019 | Nagarajan ............. G06F 3/0659 |
| 2020/0201547 A1* | 6/2020 | Jung ................... G06F 12/0802 |
| 2021/0004165 A1 | 1/2021 | Benisty |
| 2021/0011842 A1 | 1/2021 | Lee |
| 2021/0034297 A1 | 2/2021 | Park et al. |

FOREIGN PATENT DOCUMENTS

| | | |
|---|---|---|
| KR | 10-2011-0015023 A | 2/2011 |
| KR | 10-2014-0033964 A | 3/2014 |

\* cited by examiner

STORAGE DEVICE AND METHOD FOR ACCELERATING STORAGE DEVICE WRITE AND READ SPEED USING A TURBO-WRITE BUFFER

CROSS-REFERENCE TO RELATED APPLICATIONS

This application is a continuation application of U.S. patent application Ser. No. 16/896,839 filed on Jun. 9, 2020, which claims priority under 35 U.S.C. § 119 to Korean Patent Application No. 10-2019-0094014 filed on Aug. 1, 2019, in the Korean Intellectual Property Office, the disclosures of which are incorporated by reference herein in their entirety.

BACKGROUND

Embodiments of the inventive concept disclosed herein relate to a semiconductor device, and more particularly, to a storage device accelerating a write speed and a read speed and an operating method of the storage device.

Semiconductor memory devices are used in devices such as computers, tablets, cameras, and smartphones as volatile memory, where the volatile memory is used to store temporary data. Volatile memory devices transfer information very quickly, but the temporarily stored data is then removed when the device is powered off.

Alternatively, nonvolatile memory devices, such as phase-change RAM (PRAM), magnetic RAM (MRAM), resistive RAM (RRAM), ferroelectric RAM (FRAM), and flash memory, preserves data when the device is turned off. Nonvolatile memory devices often transfer information more slowly than a volatile memory device. However, flash memory allows for nonvolatile storage of data and fast operational speed. A universal flash storage (UFS) standard provides a flash storage specification. As technology progresses, the UFS standard is changed to improve memory performance.

When the UFS standard is updated, older technology may be required to adapt in order to meet the new specifications. Therefore, there is a need in the art for systems and methods that enable older UFS standard memory devices to communicate with the newest generation of UFS devices.

SUMMARY

Embodiments of the inventive concept provide a storage device accelerating a write speed and a read speed.

According to an exemplary embodiment, a storage device includes a nonvolatile memory device that includes a first area, a second area, and a third area, and a controller that receives a write command and first data from an external host device, preferentially writes the first data in the first area or the second area rather than the third area when the first data are associated with a turbo write, and writes the first data in the first area, the second area, or the third area based on a normal write policy when the first data are associated with a normal write. The controller receives a move command from the external host device and moves second data stored in the first area, the second area, or the third area to a different area based on the move command.

According to an exemplary embodiment, a storage device includes a nonvolatile memory device that includes a first area, a second area, and a third area, and a controller that selectively supports a flush operation where data stored in the second area are moved to the third area and prohibits a flush operation where data stored in the first area are moved to the third area. The controller receives a move command including move information from the external host device, reads data from the first area, the second area, or the third area based on the move command, and moves the data to a different area.

According to an exemplary embodiment, an operating method of a storage device which includes a first area, a second area, and a third area includes receiving, at the storage device, a first write command and first data, writing, at the storage device, the first data in the first area, the second area, or the third area based on a normal write policy in response to the first write command, receiving, at the storage device, a query request enabling a turbo write, receiving, at the storage device, a second write command and second data, preferentially writing, at the storage device, the second data in the first area or the second area in response to the second write command, receiving, at the storage device, a move command, and moving, at the storage device, third data stored in the first area, the second area, or the third area to a different area in response to the move command.

According to an exemplary embodiment, A method of data storage, the method comprising: receive a move command, wherein the move command specifies data to be moved within a nonvolatile memory device between a turbo write buffer and a user storage area; identify an activate mode based on the move command; move the data at a first time, wherein the first time is based on the activate mode; and transmit a response to the external host device at a second time, wherein the second time is based on the activate mode.

In some cases, the activate mode comprises one from a set consisting of: a first mode to transmit the response to the external host device after moving the data; a second mode to move the data after transmitting the response to the external host device; and a third mode to move a first portion of the data, to transmit the response to the external host device, and then to move a second portion of the data.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

The present disclosure describes systems and methods that enable older universal flash storage (UFS) standard memory devices to communicate with newer generations of UFS devices. For example, a newer UFS standard may include a turbo write specification. According to a turbo write procedure, a portion of a storage space of a UFS device may be used as a multi-level cell (MLC) space (e.g., a triple-level cell (TLC) space), and the remaining portion may be used as a single-level cell (SLC) space. A host may identify a sum of a TLC capacity and an SLC capacity as the total capacity of the UFS device.

A UFS device may enable or disable the turbo write procedure based on a request of the host. When the turbo write procedure is enabled, the UFS device may accelerate write speed by preferentially writing data received from the host in the SLC space. The term "preferentially write" refers to a policy for writing data (e.g., to a first or second area) if an area is available for writing data, and if not, writing to a different area (e.g., a third area).

Additionally, the read speed of the SLC space may be higher than the read speed of the TLC space. Thus, the read speed of data stored in the SLC space of the UFS device may also be accelerated. Accordingly, the inventive concept provides means for a host to request a turbo read process from a UFS device according to a UFS standard that includes a turbo write specification.

Below, embodiments of the inventive concept may be described in detail and clearly to such an extent that an ordinary one in the art easily implements the inventive concept.

Figure 1:
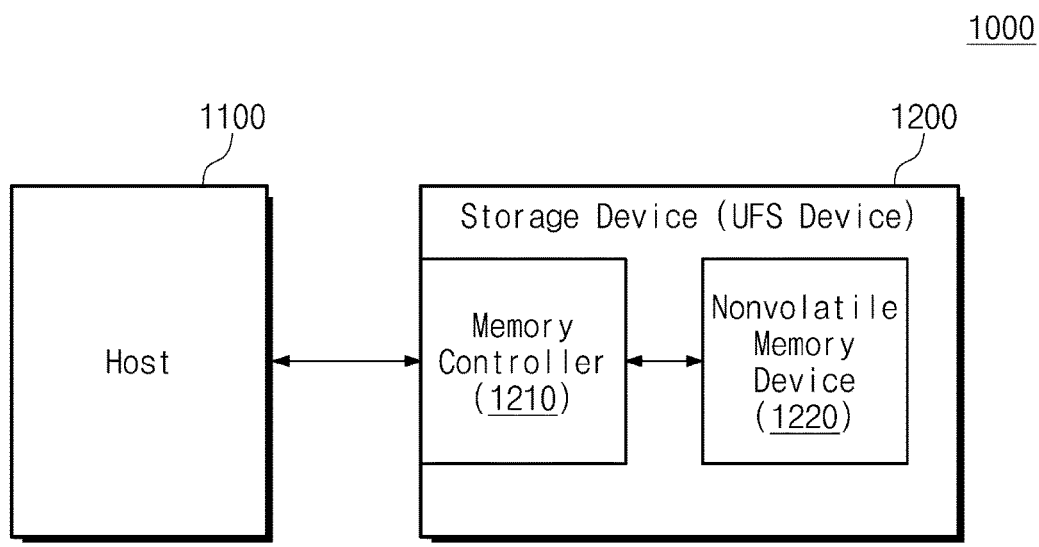
FIG. 1 is a block diagram illustrating a storage system according to an embodiment of the inventive concept.

FIG. 1 is a block diagram illustrating a storage system according to an exemplary embodiment of the inventive concept. Referring to FIG. 1, a storage system 1000 may include a host 1100 and a storage device 1200. In an exemplary embodiment of the inventive concept, the storage system 1000 may include one of various computing systems such as a personal computer, a notebook, a tablet, a smartphone, and a wearable device.

The host 1100 may store data in the storage device 1200 or may read data stored in the storage device 1200. For example, the host 1100 may transfer a write command and write data to the storage device 1200 to store data in the storage device 1200. Alternatively, to read data from the storage device 1200, the host 1100 may transfer a read command to the storage device 1200 and may receive data from the storage device 1200.

The host 1100 may include a main processor such as a central processing unit (CPU) or an application processor (AP). In addition, the host 1100 may include an auxiliary processor, which assists the main processor, such as a graphics processing unit (GPU) or a neural processing unit (NPU).

The storage device 1200 may operate under control of the host 1100. For example, the storage device 1200 may include a controller 1210 and a nonvolatile memory device 1220. The controller 1210, also referred to as a memory controller, may operate in response to a command received from the host 1100. For example, the controller 1210 may receive a write command and write data from the host 1100 and may store the received write data in the nonvolatile memory device 1220 in response to the received write command.

Alternatively, the controller 1210 may receive a read command from the host 1100 and may read data stored in the nonvolatile memory device 1220 in response to the received read command. Afterwards, the controller 1210 may transfer the read data to the host 1100. In an exemplary embodiment of the inventive concept, the nonvolatile memory device 1220 may be a NAND flash memory device, but the inventive concept is not limited thereto.

In an exemplary embodiment of the inventive concept, the host 1100 may communicate with the storage device 1200 based on a universal flash storage (UFS) interface or protocol defined by the JEDEC standard. For example, the host 1100 and the storage device 1200 may exchange packets in the form of a UFS protocol information unit (UPIU). The UPIU may include various information defined by an interface (e.g., a UFS interface) between the host 1100 and the storage device 1200. However, the inventive concept is not limited thereto. Below, for convenience of description, the terms "command", "UPIU", and "data" may be interchangeable, and the terms may have the same meaning or different meanings depending on the embodiments disclosed herein.

In an exemplary embodiment of the inventive concept, the storage device 1200 may support a turbo write function or a turbo write feature. The turbo write function may be enabled or disabled under control of the host 1100. When the turbo write function is enabled under control of the host 1100, the storage device 1200 may perform a turbo write operation. The turbo write operation may be performed based on a single level cell (SLC) buffering scheme but, not limited thereto, and may provide improved performance (in particular, improved write performance) of the storage device 1200. The turbo write operation will be more fully described with reference to drawings below.

Figure 2:
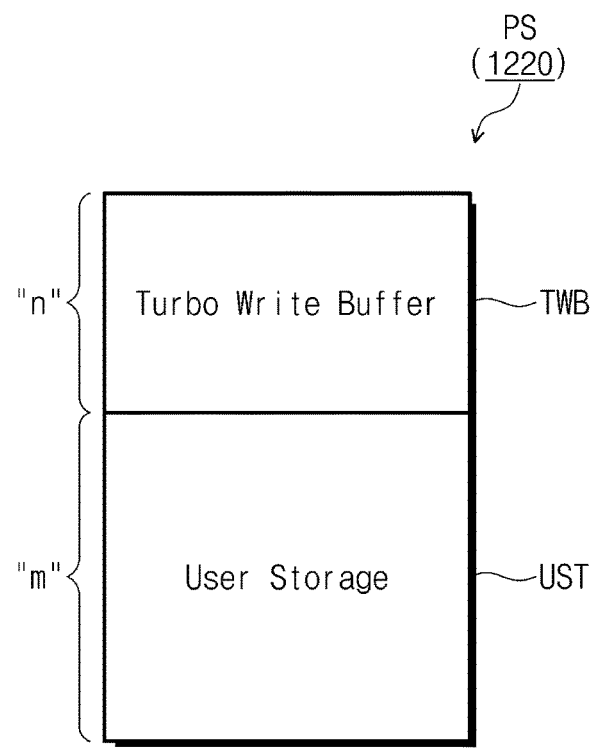
FIG. 2 is a diagram illustrating a physical storage space of a storage device of FIG. 1.

FIG. 2 is a diagram illustrating a physical storage space PS of the storage device 1200 of FIG. 1. The physical storage space PS of the storage device 1200 may indicate a physical area of the nonvolatile memory device 1220, in which user data are actually stored. In other words, the physical storage space PS may be a space that is identified by the host 1100 as a capacity of the storage device 1200.

The host 1100 and the storage device 1200 may be implemented in compliance with the UFS protocol proposed by JEDEC for the purpose of communicating with each other, but the inventive concept is not limited thereto.

In an exemplary embodiment of the inventive concept, the storage device 1200 may further include any other storage space (e.g., a space not identified by the host 1100 as a capacity of the storage device 1200, such as a reserved area, a meta area for storing meta data, or an overprovisioning area for improving performance), as well as the physical storage space PS illustrated in FIG. 2. However, for convenience of description, additional description associated with the other storage space will be omitted (or minimized), and a description will be focused on the physical storage space PS where user data are stored.

Referring to FIGS. 1 and 2, the physical storage space PS of the storage device 1200 may include a turbo write buffer area (TWB) (hereinafter referred to as a "turbo write buffer") and a user storage area (UST) (hereinafter referred to as a "user storage"). The user storage and the turbo write buffer may be referred to as a first region, a second region, a third region, etc.

The turbo write buffer TWB may correspond to a portion (e.g., "a") of the physical storage space PS of the nonvolatile memory device 1220. The user storage UST may correspond to the remaining portion (e.g., "b") of the physical storage space PS of the nonvolatile memory device 1220. Alternatively, the user storage UST may correspond to the entire (e.g., a+b) the physical storage space PS of the nonvolatile memory device 1220.

In an exemplary embodiment of the inventive concept, each memory cell corresponding to the turbo write buffer TWB may be an SLC, and each memory cell corresponding to the user storage UST may be a triple level cell (TLC). Alternatively, each of the memory cells corresponding to the turbo write buffer TWB may store n-bit data (n being a positive integer), and each of the memory cells corresponding to the user storage UST may store m-bit data (m being a positive integer greater than n). In other words, the turbo write buffer TWB may be an area supporting a higher write speed than the user storage UST.

The inventive concept is not limited to the above description regarding the turbo write buffer TWB and the user storage UST. For example, the number (e.g., k) of bits stored in each memory cell corresponding to the turbo write buffer TWB may be more than or equal to the number (e.g., i) of bits stored in each memory cell corresponding to the user storage UST (i.e., k≥i). In an exemplary embodiment of the inventive concept, in the turbo write buffer TWB and the user storage UST, the number of bits to be stored per memory cell may be determined by various factors of the storage device 1200 such as reliability and lifetime. Alternatively, the turbo write buffer TWB and the user storage UST may be divided by various factors such as reliability and lifetime of the storage device 1200, as well as the number of bits to be stored per memory cell.

In an exemplary embodiment of the inventive concept, each of the reference symbols "a" and "b" may be the number of memory blocks in the corresponding storage space. Values of "a" and "b" may be variously changed depending on sizes of the turbo write buffer TWB and the user storage UST and a scheme to implement the turbo write buffer TWB and the user storage UST (e.g., SLC, multi-level cell (MLC), TLC, and quad level cell (QLC)).

As described with reference to FIG. 1, the storage device 1200 may support a normal write function and a turbo write function. When the turbo write function is enabled by the host 1100, the storage device 1200 may perform the turbo write operation. When the turbo write function is disabled by the host 1100, the storage device 1200 may perform the normal write operation.

For example, in the case where the turbo write function is enabled, the storage device 1200 may preferentially write the write data received from the host 1100 in the turbo write buffer TWB. In this case, because write data received from the host 1100 are written in the turbo write buffer TWB (e.g., SLC program), a fast operating speed may be secured compared to the case where the normal write operation (e.g., TLC program) is performed on the user storage UST. In the case where the turbo write function is disabled, the storage device 1200 may not first write the write data in the turbo write buffer TWB. Depending on an internally assigned policy (e.g., a normal write policy), the storage device 1200 may directly write the write data in the user storage UST or may write the write data in the turbo write buffer TWB. How to write the write data may be determined based on various factors, such as the data share of the turbo write buffer TWB and a status of the physical storage space PS, depending on the normal write policy.

As another example, the normal write policy may first write the write data in the user storage UST. To explain the inventive concept more clearly, in the following detailed description, the normal write policy is a policy in which write data are preferentially written in the user storage UST. However, the inventive concept is not limited thereto.

In an exemplary embodiment of the inventive concept, data written in the turbo write buffer TWB may be flushed or migrated to the user storage UST depending on an explicit command from the host 1100 or an internally assigned policy.

Figure 3A:
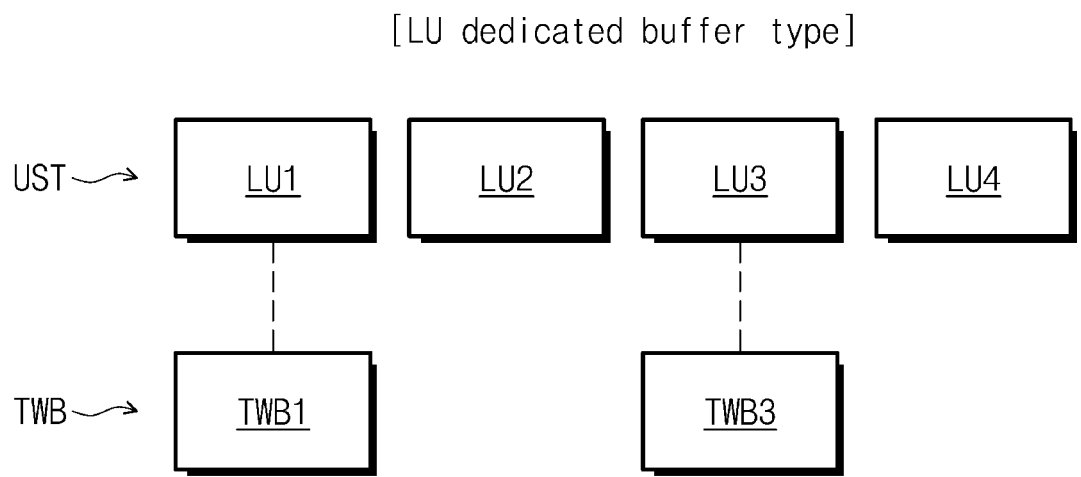
FIGS. 3A and 3B are diagrams for describing a turbo write buffer type of FIG. 2.
Figure 3B:
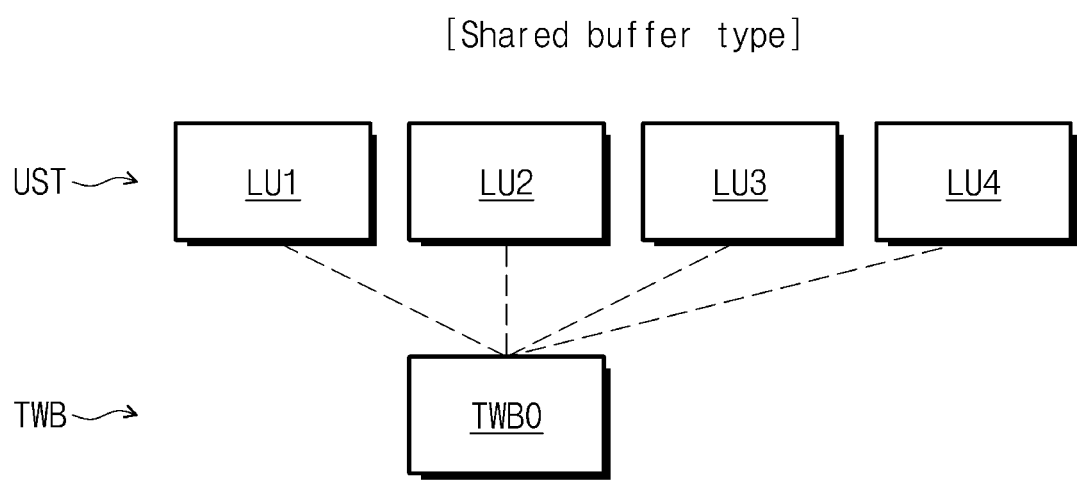

FIGS. 3A and 3B are diagrams for describing a turbo write buffer of FIG. 2. Referring to FIGS. 1, 2, 3A, and 3B, the storage device 1200 may include first, second, third and fourth logical units LU1, LU2, LU3 and LU4. Each of the first to fourth logical units LU1 to LU4 may be an externally addressable, independent, processing entity that processes a command from the host 1100. The host 1100 may manage the storage space of the storage device 1200 through the first to fourth logical units LU1 to LU4. Each of the first to fourth logical units LU1 to LU4 may be used to store data at the storage device 1200.

Each of the first to fourth logical units LU1 to LU4 may be associated with at least one memory block of the nonvolatile memory device 1220. Various kinds of logical units that are used for various purposes may exist. However, the first to fourth logical units LU1 to LU4 may correspond to the physical storage space PS and may be used to store data of the host 1100.

The first to fourth logical units LU1 to LU4 are illustrated in FIGS. 3A and 3B, but the inventive concept is not limited thereto. For example, the storage device 1200 may further include other logical units for storing and managing user data, as well as the first to fourth logical units LU1 to LU4. Alternatively, the storage device 1200 may further include other logical units for supporting various functions, as well as the first to fourth logical units LU1 to LU4.

The turbo write buffer TWB of the storage device 1200 may be configured in various types. The turbo write buffer TWB may be configured in one of a logical unit (LU) dedicated buffer type and a shared buffer type.

In the case of the LU dedicated buffer type, the turbo write buffer TWB may be configured independently or individually for each logical unit LU. For example, as illustrated in FIG. 3A, in the LU dedicated buffer type, a first turbo write buffer TWB1 may be configured with respect to the first logical unit LU1 of the first to fourth logical units LU1 to LU4, and a third turbo write buffer TWB3 may be configured with respect to the third logical unit LU3 of the first to fourth logical units LU1 to LU4.

In the LU dedicated buffer type of FIG. 3A, in the case where the write command for the first logical unit LU1 is received after the turbo write is enabled, the write data may be preferentially written in the first turbo write buffer TWB1 corresponding to the first logical unit LU1. In the case where the write command for the third logical unit LU3 is received after the turbo write function is enabled, the write data may be preferentially written in the third turbo write buffer TWB3 corresponding to the third logical unit LU3.

In the case where there are received write commands for the second and fourth logical units LU2 and LU4 to which the turbo write buffers TWB are not assigned, the write data may be written in the user storage UST corresponding to the second and fourth logical units LU2 and LU4. In addition, in the case where the write command for the first logical unit LU1 or the third logical unit LU3 is received after the turbo write is disabled, depending on the normal write policy, the write data may be written in the user storage UST of the first logical unit LU1 or the first turbo write buffer TWB1 or may be written in the user storage UST of the third logical unit LU3 or the third turbo write buffer TWB3.

In an exemplary embodiment of the inventive concept, capacities of the first and third turbo write buffers TWB1 and TWB3 may be set independently of each other. However, the inventive concept is not limited thereto. For example, the number of logical units to which turbo write buffers are respectively assigned, a capacity of each turbo write buffer, etc., may be variously changed or modified.

In an exemplary embodiment of the inventive concept, a size of the turbo write buffer TWB for each logical unit may be set to a turbo write buffer size field per unit (e.g., "dLUNumTurboWriteBufferAllocUnits") of a unit descriptor. In an exemplary embodiment of the inventive concept, the turbo write buffer size field per unit (e.g., "dLUNumTurboWriteBufferAllocUnits") may be a configurable parameter.

In the case of the shared buffer type, one turbo write buffer may be configured with respect to all the logical units. For example, as illustrated in FIG. 3B, in the shared buffer type, there may be configured one turbo write buffer TWB0 shared by all the first to fourth logical units LU1 to LU4.

In this case, when a write command for each of the first to fourth logical units LU1 to LU4 is received after the turbo write function is enabled, the write data may be first written in the shared turbo write buffer TWB0. In the case where the write command for each of the first to fourth logical units LU1 to LU4 is received after the turbo write is disabled, the write data may be written in the user storage UST of each of the first to fourth logical units LU1 to LU4 or in the shared turbo write buffer TWB0 according to the normal write policy.

As described above, the storage device 1200 may include the turbo write buffer TWB for supporting the turbo write function. Depending on a buffer type (e.g., the LU dedicated buffer type or the shared buffer type), the turbo write buffer TWB may be configured with respect to each of a plurality of logical units or one turbo write buffer TWB may be configured to be shared by all of the logical units.

Figure 4A:
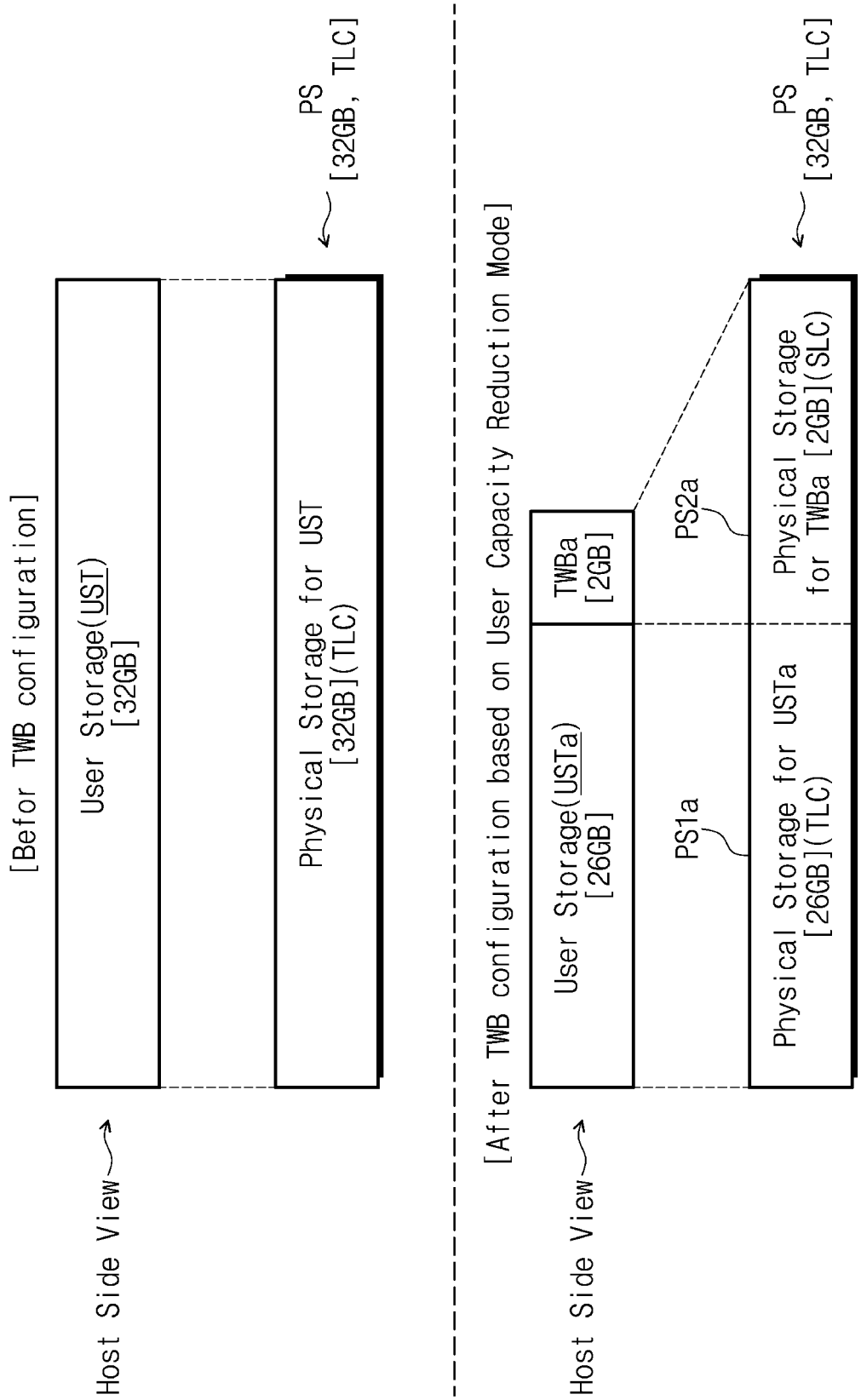
FIGS. 4A and 4B are diagrams for describing modes to configure a turbo write buffer of a storage device of FIG. 1.
Figure 4B:
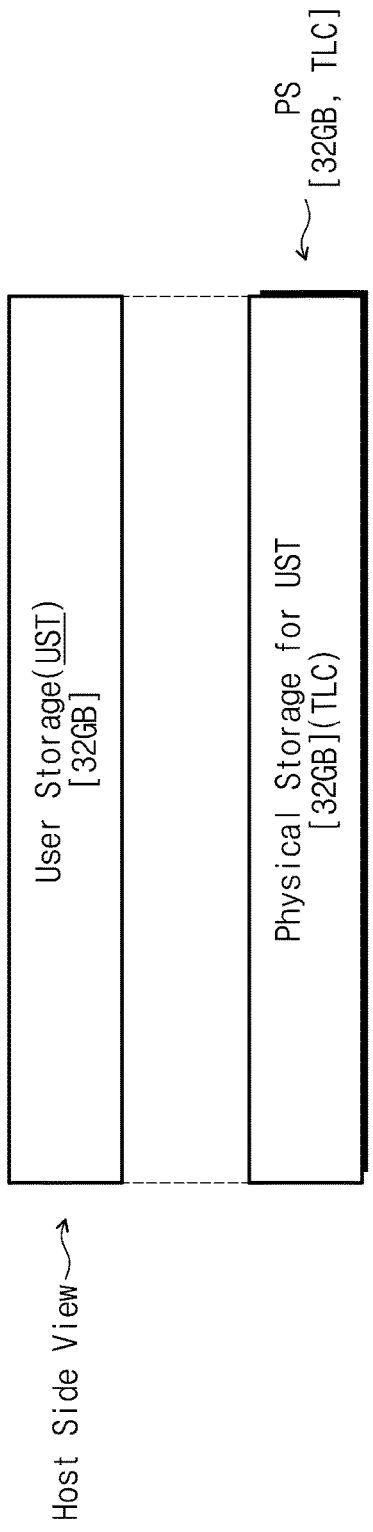
Figure 4B:
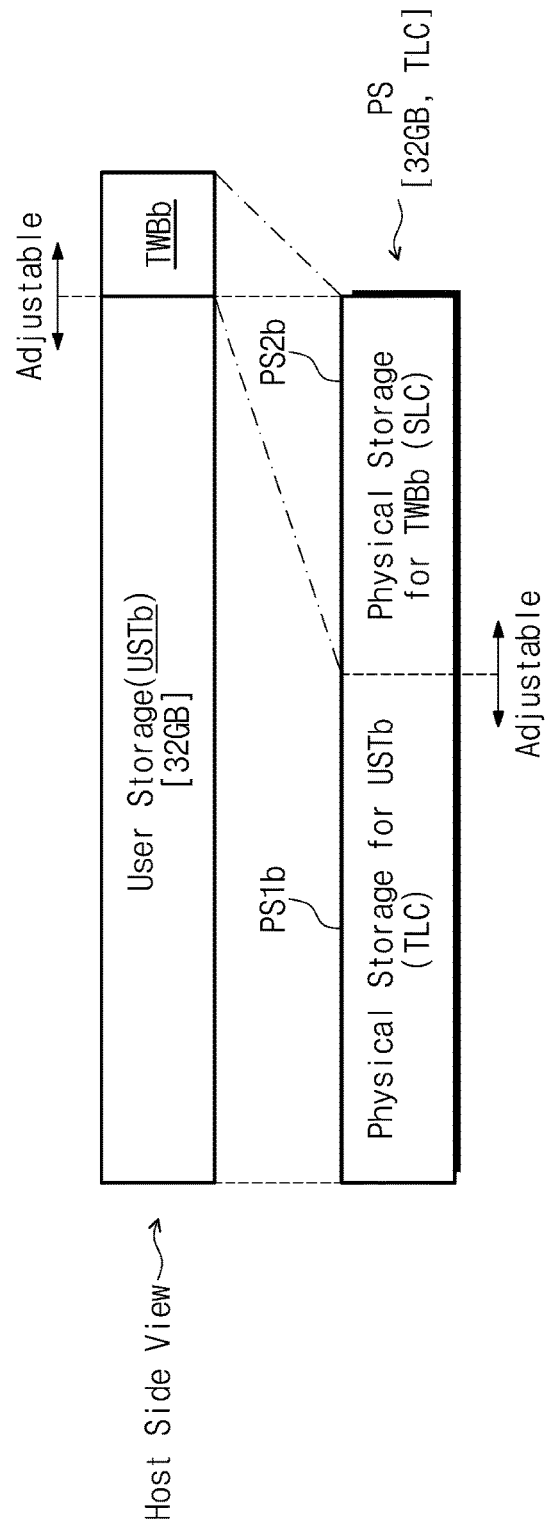

FIGS. 4A and 4B are diagrams for describing modes to configure a turbo write buffer of a storage device of FIG. 1. Below, for convenience of description, it is assumed that the physical storage space PS of the storage device 1200 is 32 GB on the basis of the TLC. In other words, in the case where each memory cell included in the storage device 1200 stores 3-bit data, the storage device 1200 may store user data of 32 GB.

However, the inventive concept is not limited thereto. For example, the physical storage space PS of the storage device 1200 may be variously changed depending on a scheme to implement the storage device 1200 or the nonvolatile memory device 1220, for example, depending on a memory cell type (e.g., SLC, MLC, TLC, or QLC), the number of memory cells, a memory cell structure, an overprovisioning ratio, etc.

Referring to FIGS. 1, 4A, and 4B, the storage device 1200 may configure a physical storage space of the turbo write buffer TWB depending on various modes. For example, the storage device 1200 may configure a physical storage space of a turbo write buffer based on one of a user capacity reduction mode and a no user capacity reduction mode.

The user capacity reduction mode may be a mode to reduce a user capacity of user storage USTa for the purpose of configuring a turbo write buffer TWBa. For example, as illustrated in FIG. 4A, the physical storage space PS of the storage device 1200 may be 32 GB on the basis of the TLC. Before the turbo write buffer TWB is configured, the capacity of 32 GB (e.g., the entire capacity of the physical storage space PS) may be assigned to the user storage UST or may be used for the user storage UST. In this case, the user storage UST may be recognized to be 32 GB from a point of view of the host 1100.

The turbo write buffer TWB may be configured depending on the user capacity reduction mode. In this case, a second physical storage space PS2a, which is a portion of the physical storage space PS, may be assigned to a turbo write buffer TWBa or may be used for the turbo write buffer TWBa.

In addition, a first physical storage space PS1a, which is a portion of the physical storage space PS, may be assigned to the user storage USTa or may be used for the user storage USTa. In this case, compared with the case where the turbo write buffer TWBa is not configured, the capacity of the user storage USTa may decrease (e.g., from 32 GB to 26 GB) from a point of view of the host 1100.

In an exemplary embodiment of the inventive concept, the first physical storage space PS1a corresponding to the user storage USTa may be implemented with the TLC, and the second physical storage space PS2a corresponding to the turbo write buffer TWBa may be implemented with the SLC. A ratio of capacities when the same storage space is used as the TLC and the SLC may be "3:1".

In other words, when the size of the turbo write buffer TWBa increases as much as 1 GB, a size of a logical storage space of the user storage USTa may decrease as much as 3 GB. As described above, in the case where the turbo write buffer TWBa is configured in the user capacity reduction mode, a portion of the physical storage space PS of the storage device 1200 may be assigned for the turbo write buffer TWBa, and thus, a capacity of the user storage USTa identified by the host 1100 may be decreased.

In an exemplary embodiment of the inventive concept, the first physical storage space PS1a corresponding to the user storage USTa and the second physical storage space PS2a corresponding to the turbo write buffer TWBa may be physically adjacent to each other or may be physically spaced from each other.

The no user capacity reduction mode may be a mode in which a logical storage capacity of user storage USTb recognized by the host 1100 is not reduced even though a turbo write buffer TWBb is configured. For example, as illustrated in FIG. 4B, before the configuration of the turbo write buffer TWB, the user storage UST may have the capacity of 32 GB. In other words, the physical storage space PS of the storage device 1200 may be assigned to the user storage UST or may be used for the user storage UST.

In the case where the turbo write buffer TWB is configured based on the no user capacity reduction mode, the turbo write buffer TWBb having a particular capacity (e.g., 2 GB) may be configured. A second physical storage space PS2b, which is a portion of the physical storage space PS, may be assigned to the turbo write buffer TWBb or may be used for the turbo write buffer TWBb.

Unlike the user capacity reduction mode, the user storage USTb in the no user capacity reduction mode may maintain the capacity of 32 GB. In other words, in the no user capacity reduction mode, even though the turbo write buffer TWBb is configured, the capacity of the user storage UST identified from a point of view of the host 1100 may be identical to that before the configuration of the turbo write buffer TWBb.

In an exemplary embodiment of the inventive concept, in the no user capacity reduction mode, a size or configuration of the turbo write buffer TWBb may be varied by an internal policy of the storage device 1200 or an explicit request from the host 1100. For example, because the second physical storage space PS2b, which is a portion of the physical storage space PS, is used to configure the turbo write buffer TWBb, the first physical storage space PS1b to be used for the user storage USTb may be smaller than a capacity of the user storage USTb.

In other words, in the case where the entire first physical storage space PS1b is used to store user data or an available free capacity of the first physical storage space PS1b is equal to or smaller than a reference value, all or a portion of the second physical storage space PS2b used for the turbo write buffer TWBb may be returned to the user storage USTb.

In other words, in the physical storage space PS, in the case where the turbo write buffer TWBb cannot be maintained due to a lack of the available space for the user storage USTb, the second physical storage space PS2b assigned for the turbo write buffer TWBb may be returned to the user storage USTb. The above-described return operation may be performed, for example, through a user data flush operation and an operation of setting a turbo write buffer size.

In an exemplary embodiment of the inventive concept, the host 1100 may check a current available size of the turbo write buffer TWB of the storage device 1200. For example, the storage device 1200 may set information about a current size of the turbo write buffer TWB at a current turbo write buffer size field (e.g., "dCurrentTurboWriteBufferSzie") of attributes. In addition, the storage device 1200 may set information about a ratio of a current available capacity of the turbo write buffer TWB at an available turbo write buffer size field (e.g., "dAvailableTurboWriteBufferSize") thereof.

The host 1100 may check a current available size of the turbo write buffer TWB by checking the current turbo write buffer size field and the available turbo write buffer size field of the attributes. Based on the checked information, the host 1100 may change a policy to use the turbo write or may return a physical storage space used for the turbo write buffer TWB to the user storage UST.

As another example, the storage device 1200 may autonomously return a physical storage space used for the turbo write buffer TWB to the user storage UST. For example, the storage device 1200 could periodically compare the available space of the user storage UST against a reference value to determine whether it needs to return the physical storage space used for the turbo write buffer TWB to the user storage UST. The storage device 1200 may set a status flag to indicate the turbo write buffer TWB is no longer available when it has returned the physical storage space used for the turbo write buffer TWB to the user storage UST. The status flag may be stored in a register in the storage device 1200. The host 1100 may check a changed status of the turbo write buffer TWB through the current turbo write buffer size field. The storage device 1200 could set the current turbo write buffer size field to 0 upon returning the physical storage space used for the turbo write buffer TWB to the user storage UST.

In an exemplary embodiment of the inventive concept, the storage device 1200 may provide information about a lifetime of the turbo write buffer TWB based on the number of program/erase (P/E) cycles of a physical storage space (or a memory block) assigned or used for the turbo write buffer TWB. For example, the storage device 1200 may set information about a lifetime of the turbo write buffer TWB at a turbo write buffer lifetime estimation field (e.g., "dTurboWriteBufferLifeTimeEst") of the attributes.

The host 1100 may estimate the lifetime of the turbo write buffer TWB by checking the turbo write buffer lifetime estimation field of the attributes of the storage device 1200 through a query request. In an exemplary embodiment of the inventive concept, in the no user capacity reduction mode, because the user storage UST and the turbo write buffer TWB share the physical storage space PS, in the case where a write operation is performed on the user storage UST, the lifetime of the turbo write buffer TWB may decrease.

Figure 5:
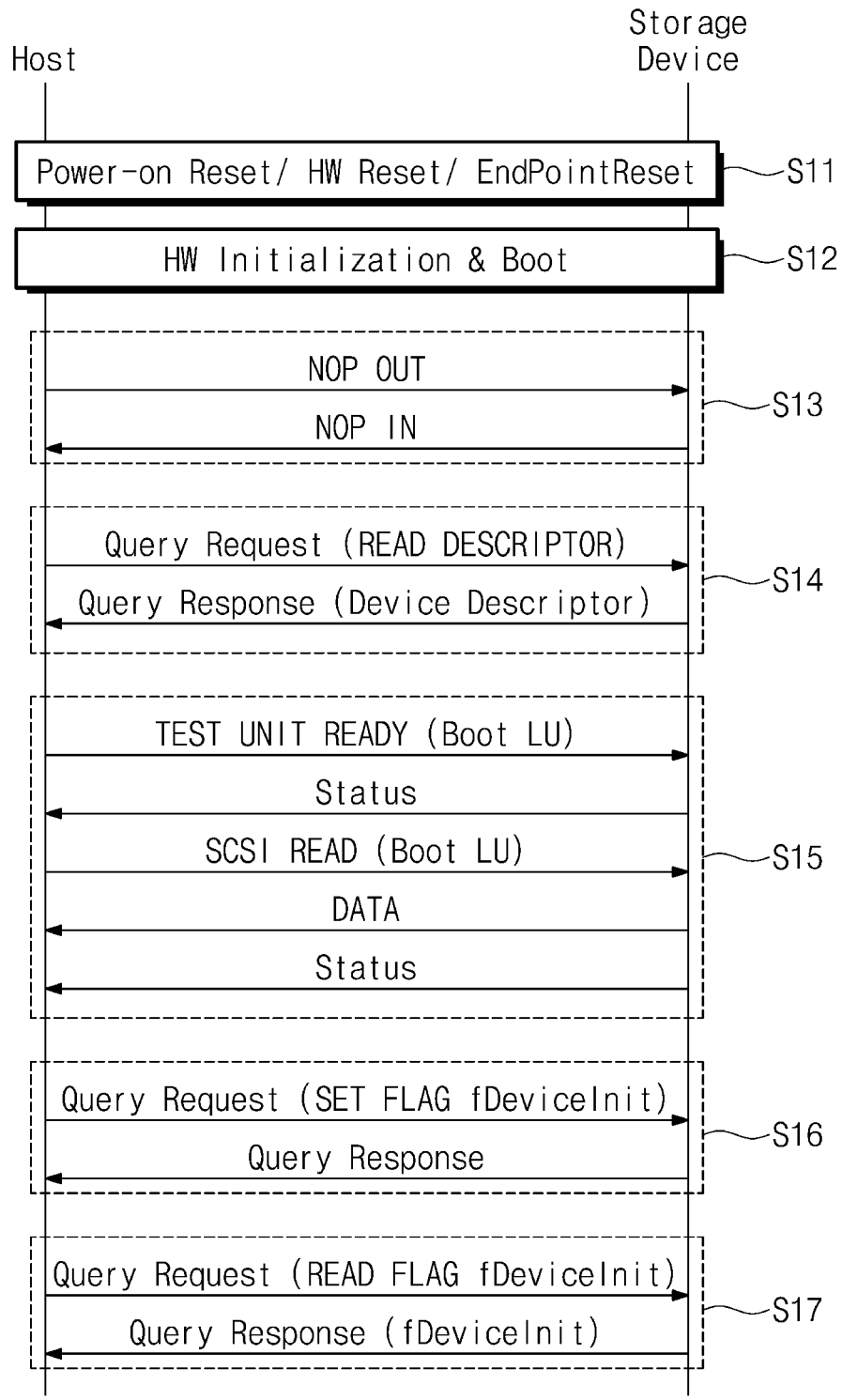
FIG. 5 is a flowchart illustrating an operation of a storage system of FIG. 1.

FIG. 5 is a flowchart illustrating an operation of a storage system of FIG. 1. An initialization operation of the storage system 1000 is described with reference to FIG. 5. Referring to FIGS. 1, 2, and 5, in operation S11, the host 1100 and the storage device 1200 may perform an operation such as a power-on reset operation, a hardware HW reset operation, or an endpoint reset operation.

In operation S12, the host 1100 and the storage device 1200 may perform hardware HW reset and booting. For example, hardware layers of each of the host 1100 and the storage device 1200 may be initialized and booted.

In operation S13, the host 1100 and the storage device 1200 may perform initialization on a particular layer (e.g., an UFS transport (UTP) layer). For example, the host 1100 may transfer the NOP OUT UPIU to the storage device 1200. The storage device 1200 may transfer the NOP IN UPIU to the host 1100 in response to the NOP OUT UPIU.

In operation S14, the host 1100 may check a device descriptor from the storage device 1200. For example, the host 1100 may transfer a query request for reading a descriptor to the storage device 1200. The storage device 1200 may transfer a query response, which includes the device descriptor, to the host 1100 in response to the query request. The query request may include a read descriptor. For example, the read descriptor may indicate to the storage device 1200 that an external device desires the device descriptor.

In an exemplary embodiment of the inventive concept, the host 1100 may check a configuration and a function of the storage device 1200 through the device descriptor. For example, the device descriptor may include an extended UFS function support field (e.g., "dExtendedUFSFeaturesSupport") including information about whether to support the turbo write function. In an exemplary embodiment of the inventive concept, the information about whether to support the turbo write function may be set to a particular bit (e.g., bit[8]) of the extended UFS function support field.

The device descriptor may further include a turbo write buffer no user space reduction enable field (e.g., "bTurboWriteBufferNoUserSpaceReductionEn") including information about a turbo write buffer mode. In the case where a value of the turbo write buffer no user space reduction enable field is "00h", the turbo write buffer TWB may be configured depending on the user capacity reduction mode described with reference to FIG. 4A. In the case where a value of the turbo write buffer no user space reduction enable field is "01h", the turbo write buffer TWB may be configured depending on the no user capacity reduction mode described with reference to FIG. 4B.

The device descriptor may further include a turbo write buffer type field (e.g., "bTurbowriteBufferType") including information about a turbo write buffer type. In the case where a value of the turbo write buffer type field is "00h", the turbo write buffer TWB may be configured depending on the LU dedicated buffer type described with reference to FIG. 3A. In the case where a value of the turbo write buffer type field is "01h", the turbo write buffer TWB may be configured depending on the shared buffer type described with reference to FIG. 3B.

The device descriptor may further include a shared turbo write buffer allocation number field (e.g., "dNumSharedTurboWriteBufferAllocUnits") including information about a size of a turbo write buffer. In the case where the number of units assigned to a shared turbo write buffer is set to "0", a turbo write buffer of the shared buffer type may not be configured.

The above-described fields are merely exemplary, and the inventive concept is not limited thereto. For example, the device descriptor may further include other fields including information about a configuration, a structure, a function, etc., of the storage device 1200, as well as the above-described fields. Various fields of the device descriptor may indicate values that are set before the initialization operation. The host 1100 may identify a current status of the storage device 1200 by reading various fields of the device descriptor.

In an exemplary embodiment of the inventive concept, the above-described fields of the device descriptor, such as "bTurboWriteBufferNoUserSpaceReductionEn", "bTurboWriteBufferType", and "dNumSharedTurboWriteBufferAllocUnits", may be varied by writing a value of a corresponding field of a configuration descriptor. In other words, the host 1100 may vary information such as a turbo write buffer type, turbo write buffer no user space reduction enable, and the number of units assigned to a turbo write buffer, by writing values of various fields of the configuration descriptor. In an exemplary embodiment of the inventive concept, a geometry descriptor of the storage device 1200 may include information such as a turbo write buffer maximum size field, a turbo write buffer maximum number field, a turbo write buffer capacity adjustment factor field, a supported turbo write buffer no user capacity reduction type field, a supported turbo write buffer type field, etc.

For example, the turbo write buffer maximum size field (e.g., "dTurboWriteBufferMaxNAllocUnits") may include information about a maximum size of the turbo write buffer TWB supported at the storage device 1200. The turbo write buffer maximum number field (e.g., "bDeviceMaxTurboWriteLUs") may include information about the maximum number of turbo write buffers supported at the storage device 1200.

The turbo write buffer capacity adjustment factor field (e.g., "bTurboWriteBufferCapAdjFac") may include information about a capacity reduction factor according to a kind of turbo write buffer memory. For example, in the case where the turbo write buffer TWB is implemented with the SLC and the user storage UST is implemented with the TLC, a value of the turbo write buffer capacity adjustment factor field may be "3". In the case where the turbo write buffer TWB is implemented with the SLC and the user storage UST is implemented with the MLC, a value of the turbo write buffer capacity adjustment factor field may be "2".

The supported turbo write buffer no user capacity reduction type field (e.g., "bSupportedTurboWriteBufferNoUserSpaceReductionTypes") may include information about whether the storage device 1200 supports any turbo write buffer mode (e.g., the user capacity reduction mode, the no user capacity reduction mode, or both).

The supported turbo write buffer type field (e.g., "bSupportedTurboWriteBufferTypes") may include information about whether the storage device 1200 supports any turbo write buffer type (e.g., the LU dedicated buffer type, the shared buffer type, or both).

The above-described fields are merely exemplary, and the inventive concept is not limited thereto.

In operation S15, the host 1100 may download a boot code from the storage device 1200. For example, the host 1100 may transfer the TEST UNIT READY UPIU to the storage device 1200. The storage device 1200 may transfer status information in response to the received TEST UNIT READY UPIU. The host 1100 may determine whether a boot logical unit (or a boot well-known LU) of the storage device 1200 is accessible, based on the received status information.

In the case where the boot logical unit is accessible, the host 1100 may transfer a SCSI READ command to the storage device 1200. In an exemplary embodiment of the inventive concept, the SCSI READ command may correspond to the boot logical unit. The storage device 1200 may transfer data "DATA" and status information to the host 1100 in response to the received command.

In operation S16, the host 1100 may complete the initialization operation by setting a flag of the storage device 1200. For example, the host 1100 may transfer the query request to the storage device 1200. The query request may be a request for setting a device initialization field (e.g., "fDeviceInit") included in the flag of the storage device 1200. In response to the query request, the device initialization field included in the flag of the storage device 1200 may be set to a particular value (e.g., "01h"). Afterwards, the storage device 1200 may transfer a query response.

In operation S17, the host 1100 may poll the device initialization field (e.g., "fDeviceInit") of the flag of the storage device 1200. For example, the host 1100 may transfer a query request SET_FLAG_fDeviceInit for reading the device initialization field of the flag to the storage device 1200, and the storage device 1200 may transfer a query response, in which the device initialization field is included, to the host 1100.

In an exemplary embodiment of the inventive concept, after operation S16, in the case where the initialization operation of the storage device 1200 is completed, the device initialization field may be reset to a different value (e.g., "00h"). In other words, the host 1100 may repeatedly perform operation S17 to check whether the device initialization field is reset. In the case where the device initialization field is reset, the initialization operation of the host 1100 and the storage device 1200 may be completed.

Figure 6:
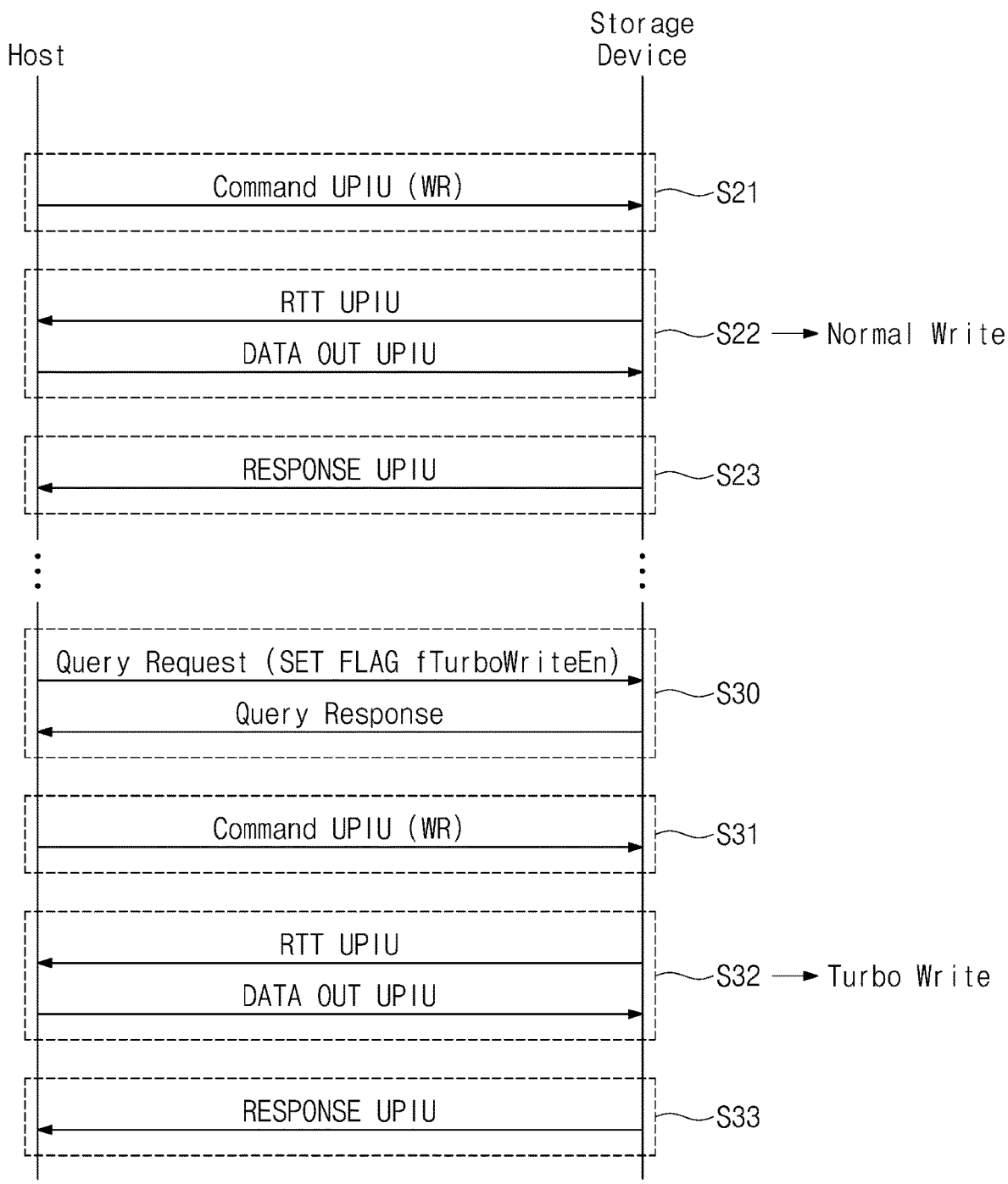
FIG. 6 is a flowchart illustrating an operation of a storage system of FIG. 1.

FIG. 6 is a flowchart illustrating an operation of a storage system of FIG. 1. A write operation of the storage system 1000 will be described with reference to FIG. 6. Referring to FIGS. 1 and 6, in operation S21, the host 1100 may transfer a CMD UPIU including a write command WR CMD to the storage device 1200.

In operation S22, the host 1100 and the storage device 1200 may perform data transaction. For example, the storage device 1200 may transfer a ready to transfer UPIU (RTT UPIU) to the host 1100. The RTT UPIU may include information about a data range where the storage device 1200 is able to receive data. The host 1100 may transfer a DATA OUT UPIU including the write data to the storage device 1200 in response to the RTT UPIU. As the above-described operation is repeatedly performed, the write data may be transferred from the host 1100 to the storage device 1200.

After all of the write data are received, in operation S23, the storage device 1200 may transfer a RESPONSE UPIU to the host 1100. The RESPONSE UPIU may include information indicating that an operation corresponding to the write command received in operation S21 is completed.

In an exemplary embodiment of the inventive concept, the storage device 1200 may perform a normal write operation on the write data received in operation S22. For example, in operation S21, the storage device 1200 may determine whether the turbo write function is enabled. More specifically, the storage device 1200 may determine whether the turbo write function is enabled, based on a value of a turbo write enable field (e.g., "fTurboWriteEn") of the flag.

In the case where a value of the turbo write enable field is "0b", the turbo write function may be in a disabled state. In the case where a value of the turbo write enable field is "1b", the turbo write function may be in an enabled state. In an exemplary embodiment of the inventive concept, a value of the turbo write enable field of the flag may be set by a query request for a set flag of the host 1100.

A value of the turbo write enable field may not be set by the host 1100. In this case, the write data received in operation S22 may be written in the turbo write buffer TWB or the user storage UST in compliance with the normal write policy.

In operation S30, the host 1100 may set a value of the turbo write enable field to a particular value (e.g., "1b"). For example, the host 1100 may transfer a query request for setting a value of the turbo write enable field to a particular value (e.g., "1b") to the storage device 1200. A value of the turbo write enable field may be set to a particular value (e.g., "1b") in response to the query request from the host 1100, and the storage device 1200 may transfer a query response to the host 1100.

Afterwards, the host 1100 may perform operation S31 to operation S33. Operation S31 to operation S33 may be similar to operation S21 to operation S23 except that the turbo write is performed depending on the turbo write enable field, and thus, additional description will be omitted to avoid redundancy.

In an exemplary embodiment of the inventive concept, the write data received in operation S32 may be written in the turbo write buffer TWB. For example, in operation S30, as a value of the turbo write enable field is set to a particular value (e.g., "1b"), the turbo write function may be enabled. In this case, the write data received from the host 1100 may be written in the turbo write buffer TWB. For example, in operation S31, the data received from the host 1100 may be stored in the pinned turbo write buffer TWB-p or the non-pinned turbo write buffer TWB-np depending on a particular factor value of the command UPIU. How to configure a turbo write buffer divided into the pinned turbo write buffer TWB-p and the non-pinned turbo write buffer TWB-np will be more fully described with reference to FIG. 8.

In an exemplary embodiment of the inventive concept, even though the turbo write function is enabled, in the case where a space of the turbo write buffer TWB is insufficient, the storage device 1200 may write the received write data in the user storage UST.

Figure 7:
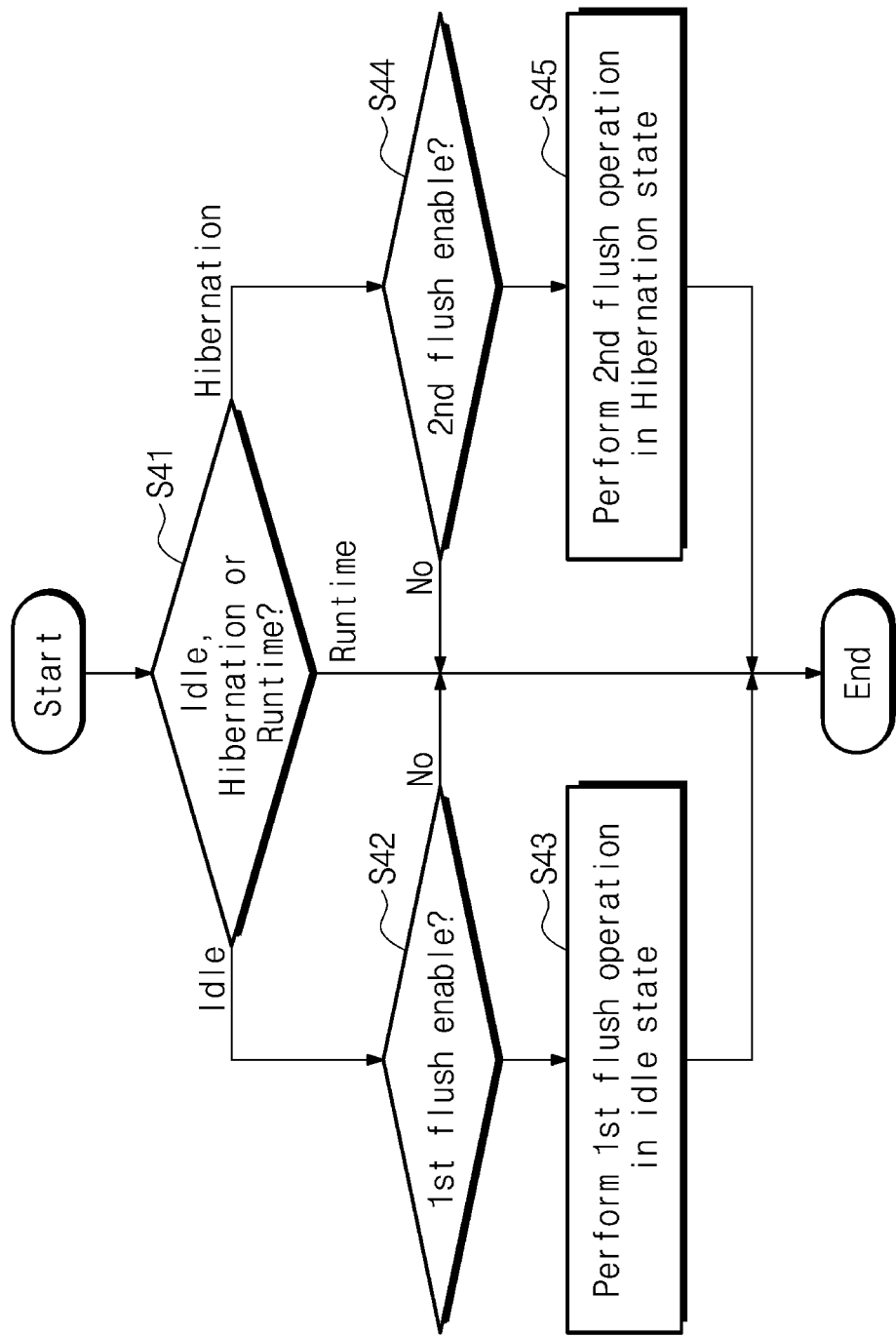
FIG. 7 is a flowchart illustrating an operation of a storage device of FIG. 1.

FIG. 7 is a flowchart illustrating an operation of a storage device of FIG. 1. A flush operation of the storage device 1200 will be described with reference to FIG. 7. Referring to FIGS. 1, 2, and 7, in operation S41, the storage device 1200 may determine whether a current state is an idle state, a hibernation state, or a runtime state. When the storage device 1200 is in the runtime state, a separate flush operation may not be performed.

For example, when the storage device 1200 is processing a command received from the host 1100, the storage device 1200 may be in the runtime state. When a command (e.g., a pending command) that is received from the host 1100 and is being processed or to be processed does not exist, the storage device 1200 may be in the idle state. When the storage device 1200 enters a low-power mode called "hibernation" by the initiation of the storage device 1200 or the host 1100, the storage device 1200 may be in the hibernation state.

When the storage device 1200 is in the idle state, in operation S42, whether a first flush operation is enabled may be determined. The host 1100 may allow or prohibit the first flush operation at the storage device 1200 by setting a value of a turbo write buffer flush enable field (e.g., "fTurboWriteBufferFlushEn") of the flag. The storage device 1200 may determine whether the first flush operation is enabled, by checking a value of the turbo write buffer flush enable field of the flag.

In an exemplary embodiment of the inventive concept, when a value of the turbo write buffer flush enable field of the flag is "0b", the first flush operation may be disabled or prohibited. When a value of the turbo write buffer flush enable field of the flag is "1b," the first flush operation may be enabled. In the case where the first flush operation is disabled, the storage device 1200 may not perform a separate flush operation.

In the case where the first flush operation is enabled, in operation S43, the storage device 1200 may perform the first flush operation during the idle state. The first flush operation may be a flush operation that the storage device 1200 performs in the idle state. The flush operation may be an operation of flushing or migrating user data written in the turbo write buffer TWB to the user storage UST, depending on the internal policy or the explicit command from the host 1100.

In an exemplary embodiment of the inventive concept, when the user data written in the turbo write buffer TWB are flushed to the user storage UST, a logical address of the flushed user data may be maintained, and a physical address may be changed. In this case, the storage device 1200 may update mapping information of the logical address and the physical address of the flushed user data. For example, the physical address may be changed from an address of the turbo write buffer TWB to an address of the user storage UST.

When a determination result of operation S41 indicates that the storage device 1200 is in the hibernation state, in operation S44, the storage device 1200 may determine whether a second flush operation is enabled. As in the above description, for example, the host 1100 may allow or prohibit the second flush operation at the storage device 1200 by setting a value of a turbo write buffer flush enable field during hibernation (e.g., "fTurboWriteBufferFlushDuringHibernat") of the flag.

The storage device 1200 may determine whether the second flush operation is enabled, by checking the value of the turbo write buffer flush enable field during hibernation of the flag. In an exemplary embodiment of the inventive concept, when a value of the turbo write buffer flush enable field during hibernation of the flag is "0b", the second flush operation may be disabled or prohibited. When a value of the turbo write buffer flush enable field during hibernation of the flag is "1b", the second flush operation may be enabled. In the case where the second flush operation is disabled, the storage device 1200 may not perform a separate flush operation.

In the case where the second flush operation is enabled, in operation S45, the storage device 1200 may perform the second flush operation during the hibernation state. The second flush operation may indicate a flush operation that the storage device 1200 performs in the hibernation state.

According to the above flush operation, user data written in the turbo write buffer TWB may be flushed or migrated to the user storage UST. As such, an available buffer size of the turbo write buffer TWB may be secured.

In an exemplary embodiment of the inventive concept, the above flush operation may be suspended under a particular condition. For example, the first flush operation that is performed in the idle state may be performed only in a state where a command queue of the storage device 1200 is empty. While the first flush operation is performed, in the case where a command is issued from the host 1100, the storage device 1200 may suspend the first flush operation being performed and may first process the command issued from the host 1100. In an exemplary embodiment of the inventive concept, in the case where the hibernation mode is terminated, the second flush operation that is performed in the hibernation state may be stopped.

As described above, a flush operation being performed may be suspended depending on a particular condition. In this case, the storage device 1200 may set suspension information (or information of the progress degree) or a current status of the flush operation at a turbo write buffer flush status field (e.g., "bTurboWriteBufferFlushStatus") of the attributes.

In an exemplary embodiment of the inventive concept, the storage device 1200 may set information, which indicates that a flush operation for the turbo write buffer TWB is required, to a particular value (e.g., bit[5]) of an exception event status (e.g., "dExceptionEventStatus") of the attributes. The host 1100 may check the particular value (e.g., bit[5]) of the exception event status of the attributes, may determine that a flush operation is required at the storage device 1200, and may set particular fields (e.g., "fTurboWriteBufferFlushEn" and "fTurboWriteBufferFlushDuringHibernate") of the flag of the storage device 1200 in compliance with a policy.

The description is given with reference to FIG. 7 as the storage device 1200 performs a flush operation based on a value of a flush enable field (i.e., a value of the turbo write buffer flush enable field or a value of the turbo write buffer flush enable field during hibernation), but the inventive concept is not limited thereto. In an exemplary embodiment, the storage device 1200 performs a flush or migration operation depending on an internal policy, regardless of a value of the flush enable field (i.e., a value of the turbo write buffer flush enable field or a value of the turbo write buffer flush enable field during hibernation). In this case, the storage device 1200 may perform the flush or migration operation depending a result of determination that is automatically made by the storage device 1200 (without intervention of the outside, or according to its own determination).

Figure 8:
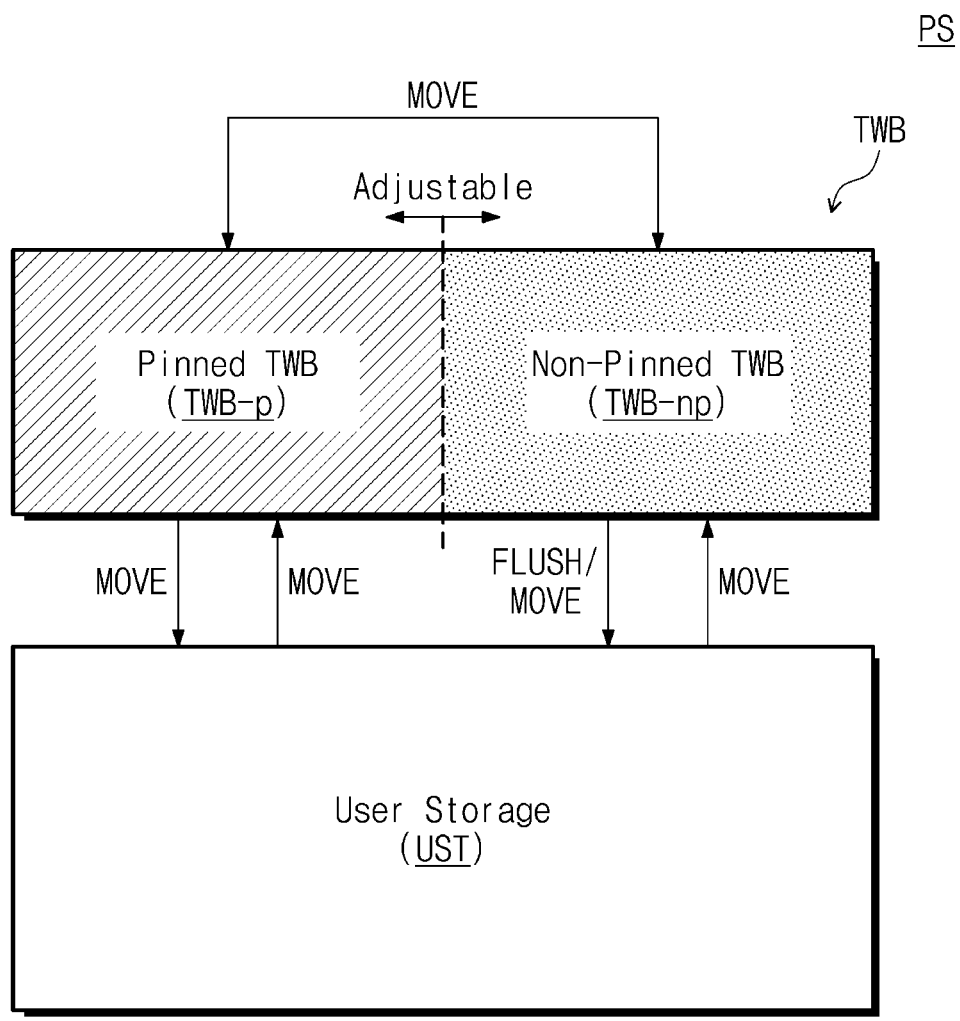
FIG. 8 is a block diagram illustrating a physical storage space of a storage device of FIG. 1.

FIG. 8 is a block diagram illustrating a physical storage space of the storage device 1200 of FIG. 1. Referring to FIGS. 1, 2 and 8, the physical storage space PS of the storage device 1200 may include the turbo write buffer TWB and the user storage UST. The physical storage space PS, the turbo write buffer TWB, and the user storage UST of the storage device 1200 are described above, and thus, additional description may be omitted to avoid redundancy.

The turbo write buffer TWB may be divided into a pinned turbo write buffer TWB-p and a non-pinned turbo write buffer TWB-np. As in the above description, in the case where the turbo write function of the storage device 1200 is enabled, the write data may be stored in one of the pinned turbo write buffer TWB-p and the non-pinned turbo write buffer TWB-np.

In an embodiment, data stored in the pinned turbo write buffer TWB-p is not targeted for a move (e.g., a migrate or a flush) to the user storage UST, and data stored in the non-pinned turbo write buffer TWB-np may be targeted for a move to the user storage UST. That is, a priority of data stored in the pinned turbo write buffer TWB-p may be higher than a priority of data stored in the non-pinned turbo write buffer TWB-np. However, the inventive concept is not limited thereto as data stored in the pinned turbo write buffer TWB-p may be targeted for a move to the non-pinned turbo write buffer TWB-np or the user storage UST depending on resources or a policy of a system. In an exemplary embodiment, a migration or flush operation is periodically performed to move data from the turbo write buffer TWB to the user storage UST. In this embodiment, all data present in the non-pinned turbo write buffer TWB-np is first migrated or flushed to the user storage UST before any data of the pinned turbo write buffer TWB-p is migrated or flushed to the user storage UST. In another embodiment, during a given migration, first data in the non-pinned turbo write buffer TWB-np is migrated to the user storage UST during a first period of the migration and second data in the pinned turbo write buffer TWB-p is migrated to the user storage UST during a second period after the first period.

One, in which the write data are to be stored, from among the pinned turbo write buffer TWB-p and the non-pinned turbo write buffer TWB-np may be determined through various schemes (e.g., an internal policy, a change of the internal policy according to a request of a host, and an explicit request of a host).

In an exemplary embodiment of the inventive concept, as described above, the size of the turbo write buffer TWB may be determined under control of the host 1100 or depending on the internal policy of the storage device 1200. In this case, a ratio of the pinned turbo write buffer TWB-p and the non-pinned turbo write buffer TWB-np in the turbo write buffer TWB may be determined or varied through various schemes (e.g., an internal policy, a change of the internal policy according to a request of a host, and an explicit request of a host).

In an exemplary embodiment of the inventive concept, user data may be flushed, migrated, or moved between the pinned turbo write buffer TWB-p, the non-pinned turbo write buffer TWB-np, and the user storage UST. For example, the user data may migrate or move between the pinned turbo write buffer TWB-p and the non-pinned turbo write buffer TWB-np depending on an explicit request of the host 1100, an internal policy of the storage device 1200, or a change of the internal policy according to a request of the host 1100.

Alternatively, the user data may migrate or move between the non-pinned turbo write buffer TWB-np and the user storage UST depending on the explicit request of the host 1100, the internal policy of the storage device 1200, or the change of the internal policy according to the request of the host 1100. For example, the user data may be flushed from the non-pinned turbo write buffer TWB-np to the user storage UST. Alternatively, the user data may migrate or move between the pinned turbo write buffer TWB-p and the user storage UST depending on the explicit request of the host 1100, the internal policy of the storage device 1200, or the change of the internal policy according to the request of the host 1100.

In an exemplary embodiment of the inventive concept, as described with reference to FIG. 7, the storage device 1200 may perform a flush operation during the idle state or the hibernation state. In this case, the storage device 1200 may perform the flush operation on the non-pinned turbo write buffer TWB-np of the turbo write buffer TWB. In other words, the storage device 1200 may flush the user data stored in the non-pinned turbo write buffer TWB-np of the turbo write buffer TWB to the user storage UST.

In this case, the user data written in the pinned turbo write buffer TWB-p may not be flushed to the user storage UST. In other words, even though the storage device 1200 performs the flush operation, the user data written in the pinned turbo write buffer TWB-p may be maintained.

As another example, depending on the internal policy of the storage device 1200, data to be stored in the non-pinned turbo write buffer TWB-np may be written in the pinned turbo write buffer TWB-p. This data may be flushed from the pinned turbo write buffer TWB-p to the user storage UST. In other words, data stored in the pinned turbo write buffer TWB-p may not be flushed by an explicit flush request from the host 1100, but may be selectively flushed to the user storage UST depending on the internal flush policy of the storage device 1200.

In an exemplary embodiment of the inventive concept, in the case where data are flushed, migrated, or moved between the pinned turbo write buffer TWB-p, the non-pinned turbo write buffer TWB-np, and the user storage UST, the controller 1210 may be configured to update a mapping relationship of the moved data. For example, in the case where data corresponding to a first logical block address is flushed or migrated from the pinned turbo write buffer TWB-p to the user storage UST, the controller 1210 may release a mapping relationship of the first logical block address and a physical address of the pinned turbo write buffer TWB-p and may update a mapping relationship of the first logical block address and a physical address of the user storage UST. The release or update of the mapping relationship may be made in a scheme similar to that described above for moving between other areas, and thus, additional description will be omitted to avoid redundancy.

Below, to explain the inventive concept more clearly, a description will be given under the assumption that data to be stored in the pinned turbo write buffer TWB-p is required to be stored in the pinned turbo write buffer TWB-p. However, the inventive concept is not limited thereto.

Accordingly, in the case where the host 1100 issues a read command for first user data written in the pinned turbo write buffer TWB-p, the first user data may be read from the pinned turbo write buffer TWB-p. In this case, it may be possible to read the first user data at a high speed.

For example, as described above, the pinned turbo write buffer TWB-p may store user data based on the SLC scheme, and the user storage UST may store user data in the TLC scheme. A time taken to read user data stored based on the SLC scheme is shorter than a time taken to read user data stored based on the TLC scheme.

In other words, as particular user data are retained in the pinned turbo write buffer TWB-p, a speed at which the particular user data are read may be improved. This function of the storage device 1200 may be called "turbo read".

In an exemplary embodiment of the inventive concept, the physical storage space PS of the storage device 1200 may indicate a storage space of the nonvolatile memory device 1220. In other words, the nonvolatile memory device 1220 may include the pinned turbo write buffer TWB-p, the non-pinned turbo write buffer TWB-np, or the user storage UST.

Figure 9:
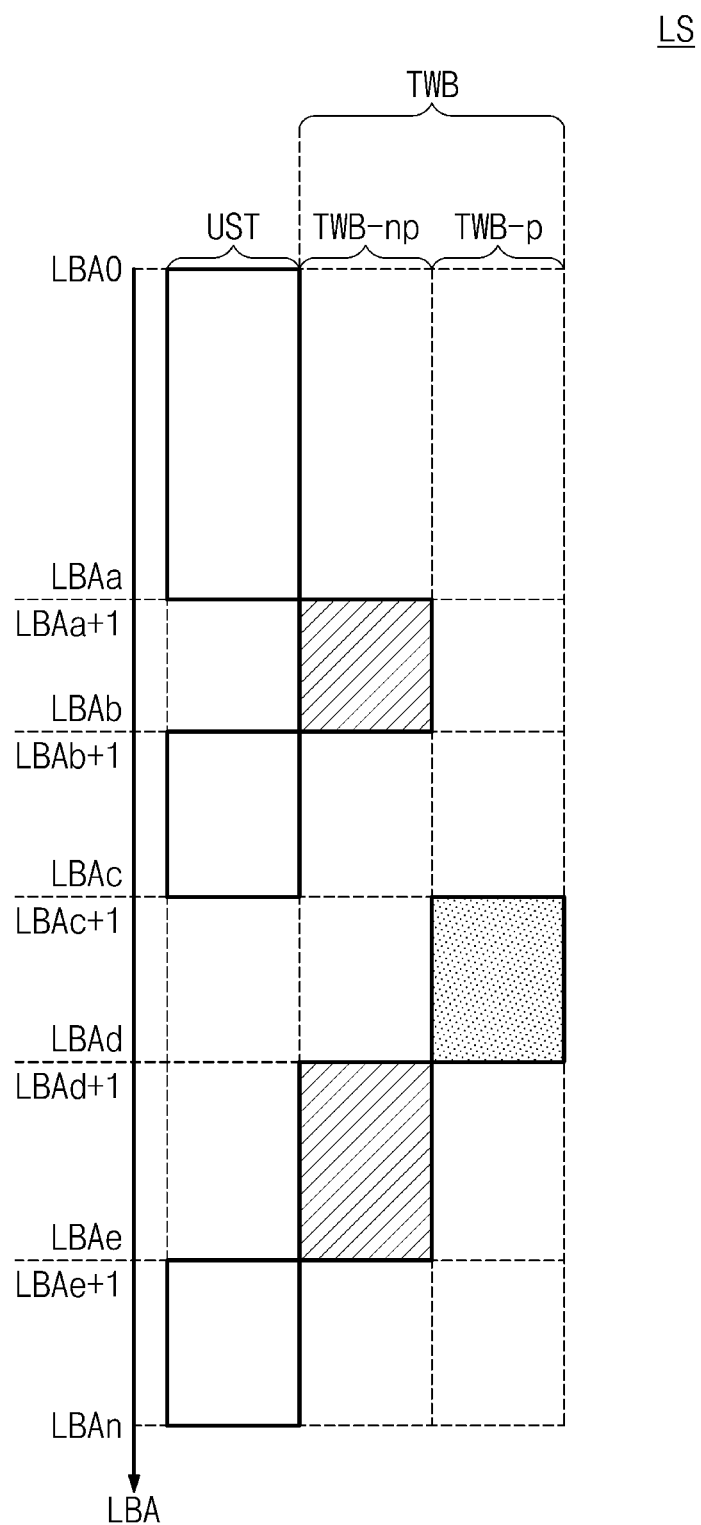
FIG. 9 is a diagram illustrating a logical storage space for a physical storage space of a storage device described with reference to FIG. 8.

FIG. 9 is a diagram illustrating a logical storage space for the physical storage space PS of the storage device 1200 described with reference to FIG. 8. For convenience of description, the embodiment of FIG. 9 will be described with reference to one logical unit. However, the inventive concept may be identically applied to two or more logical units to which the turbo write buffers TWB correspond, or a relationship between logical units and a shared turbo write buffer (e.g., TWB0).

Referring to FIGS. 1, 2 and 9, a logical storage space LS of the storage device 1200 that is identified by the host 1100 may include the user storage UST and the turbo write buffer TWB. The turbo write buffer TWB may include the pinned turbo write buffer TWB-p and the non-pinned turbo write buffer TWB-np.

A first logical block address range (e.g., LBA0 to LBAa, LBAb+1 to LBAc, and LBAe+1 to LBAn) may correspond to a logical storage space of the user storage UST. In this case, user data stored in the first logical block address range (e.g., LBA0 to LBAa, LBAb+1 to LBAc, and LBAe+1 to LBAn) may be stored in a physical storage space of the user storage UST.

A second logical block address range (e.g., LBAa+1 to LBAb and LBAd+1 to LBAe) may correspond to a logical storage space of the non-pinned turbo write buffer TWB-np. In this case, user data stored in the second logical block address range (e.g., LBAa+1 to LBAb and LBAd+1 to LBAe) may be stored in a physical storage space of the non-pinned turbo write buffer TWB-np.

A third logical block address range (e.g., LBAc+1 to LBAd) may correspond to a logical storage space of the pinned turbo write buffer TWB-p. In this case, user data stored in the third logical block address range (e.g., LBAc+1 to LBAd) may be stored in a physical storage space of the pinned turbo write buffer TWB-p.

As described above, the user storage UST, the non-pinned turbo write buffer TWB-np, and the pinned turbo write buffer TWB-p may be distributed in various forms on the logical storage space LS recognized by the host 1100. However, the inventive concept is not limited thereto and the third logical block address range may correspond to a logical storage space of the non-pinned turbo write buffer TWB-np and the second logical block address range may correspond to a logical storage space of the pinned turbo write buffer TWB-p. In an exemplary embodiment of the inventive concept, user data may be moved/flushed/migrated between the user storage UST, the non-pinned turbo write buffer TWB-np, and the pinned turbo write buffer TWB-p, depending on the explicit request of the host 1100 or the internal policy of the storage device 1200.

For example, the host 1100 may specify one of the pinned turbo write buffer TWB-p and the non-pinned turbo write buffer TWB-np in the turbo write. As another example, the host 1100 may specify one of the pinned turbo write buffer TWB-p and the non-pinned turbo write buffer TWB-np as a turbo write target before the turbo write. As yet another example, the host 1100 may not specify the pinned turbo write buffer TWB-p or the non-pinned turbo write buffer TWB-np in the turbo write.

The host 1100 may check a distribution state of data changed by the storage device 1200 by requesting (e.g., using the Query UPIU) information of the pinned turbo write buffer TWB-p and the non-pinned turbo write buffer TWB-np from the storage device 1200 periodically or if necessary.

Figure 10A:
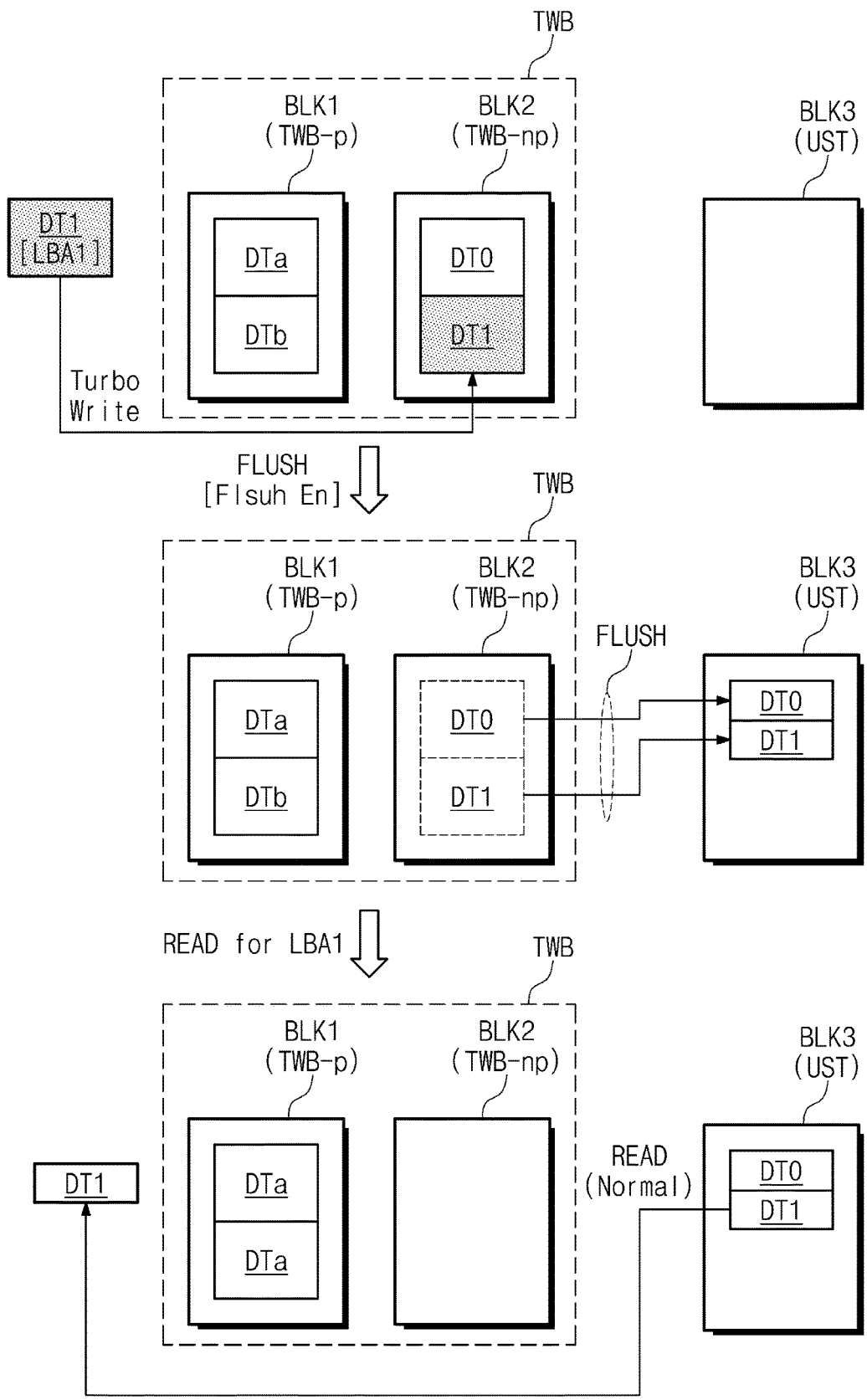
FIGS. 10A and 10B are diagrams illustrating an operation in a physical storage space of a storage device described with reference to FIG. 8.
Figure 10B:
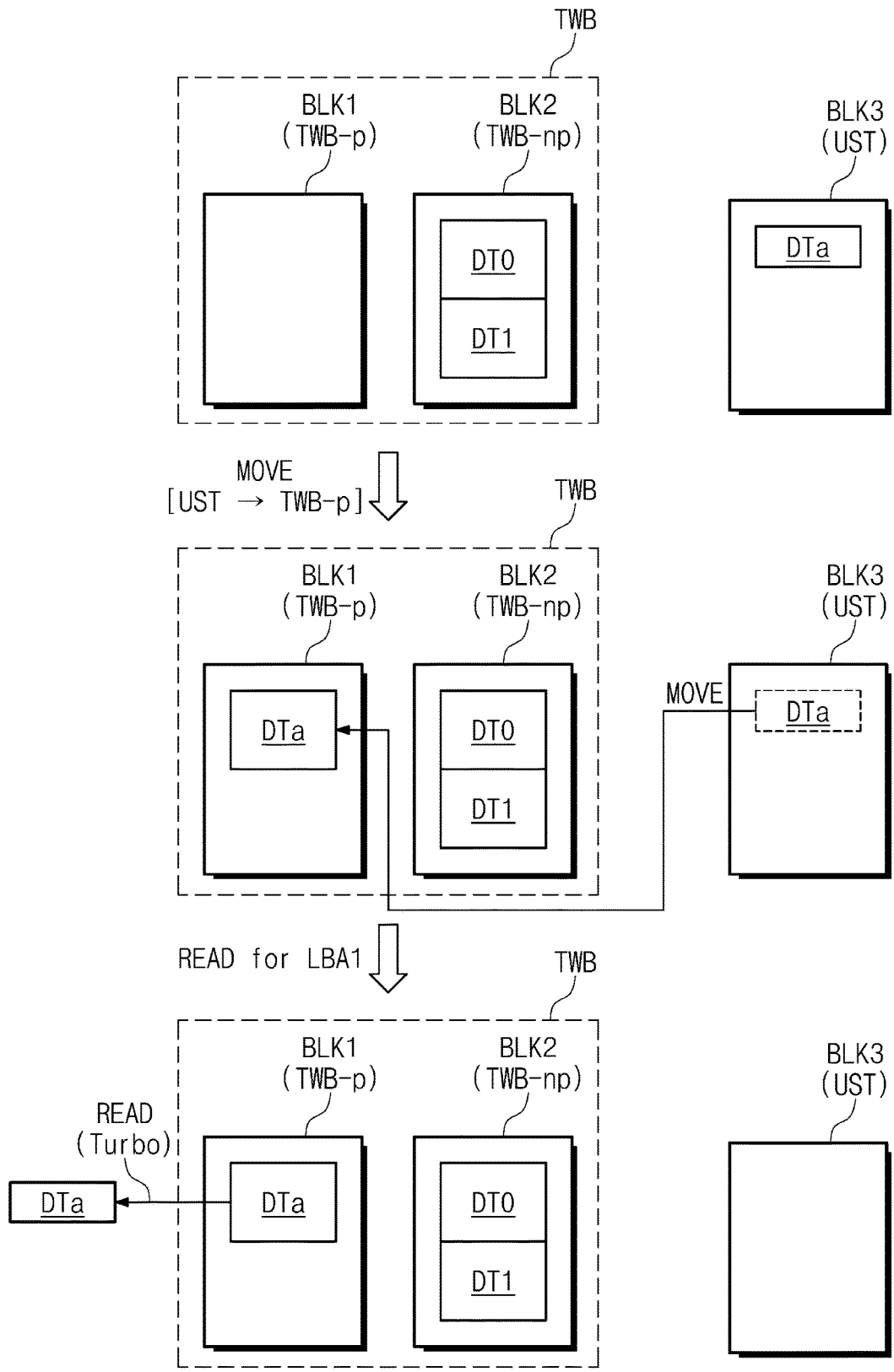

FIGS. 10A and 10B are diagrams illustrating an operation in a physical storage space of a storage device described with reference to FIG. 8. For brevity of illustration and convenience of description, it is assumed that the pinned turbo write buffer TWB-p includes a first memory block BLK1, the non-pinned turbo write buffer TWB-np includes a second memory block BLK2, and the user storage UST may include a third memory block BLK3. However, the inventive concept is not limited thereto.

Referring to FIGS. 1, 8, and 10A, the storage device 1200 may receive first data DT1 corresponding to a first logical block address LBA1 from the host 1100. In an exemplary embodiment of the inventive concept, the turbo write function of the storage device 1200 may be in an enabled state. In this case, the storage device 1200 may write the received first data DT1 in the turbo write buffer TWB (e.g., the non-pinned turbo write buffer TWB-np).

In other words, the storage device 1200 may perform the turbo write on the first data DT1. In an exemplary embodiment of the inventive concept, in the case where the turbo write function is enabled, whether to store data in any one of the pinned turbo write buffer TWB-p and the non-pinned turbo write buffer TWB-np may be determined through various schemes.

In an exemplary embodiment of the inventive concept, as illustrated in FIG. 10A, the pinned turbo write buffer TWB-p and the non-pinned turbo write buffer TWB-np may be full of user data DTa, DTb, DT0, and DT1. In this case, the storage device 1200 may notify the host 1100 that a flush operation is required, by setting a particular bit (e.g., bit[5]) of an exception event status field (e.g., "wExceptionEventStatus") of the attributes.

The host 1100 may check the exception event status field of the attributes through a query request and may check that the flush operation is required at the storage device 1200. The host 1100 may allow the flush operation of the storage device 1200 by setting the turbo write buffer flush enable field or the turbo write buffer flush enable field during hibernation of the flag of the storage device 1200 as described with reference to FIG. 7.

When the flush function is allowed (or enabled) under control of the host 1100, the storage device 1200 may perform the flush operation. For example, in the idle state or the hibernation state, the storage device 1200 may flush the user data DT0 and DT1 stored in the non-pinned turbo write buffer TWB-np to the third memory block BLK3 of the user storage UST. In an exemplary embodiment of the inventive concept, even though the flush operation is allowed under control of the host 1100, the user data DTa and DTb stored in the pinned turbo write buffer TWB-p may not be flushed to the user storage UST. In other words, the user data DTa and DTb stored in the pinned turbo write buffer TWB-p remains while the user data DT0 and DT1 stored in the non-pinned turbo write buffer TWB-np is flushed.

Afterwards, the storage device 1200 may receive a read command for the first logical address LBA1 from the host 1100. In this case, the storage device 1200 may read the first data DT1 stored in the third memory block BLK3 of the user storage UST and may output the read first data DT1 to the host 1100.

In an exemplary embodiment of the inventive concept, because the first data DT1 are written (e.g., SLC programmed) in the non-pinned turbo write buffer TWB-np but the first data DT1 are flushed to the user storage UST due to the flush operation, the first data DT1 may be read through a normal read operation (e.g., a TLC read operation). In other words, the first data DT1 may be SLC programmed but TLC read.

Referring to FIGS. 1, 8, and 10B, the 0-th and first data DT0 and DT1 may be stored in the second memory block BLK2 of the non-pinned turbo write buffer TWB-np, and the a-th data DTa may be stored in the third memory block BLK3 of the user storage UST.

Afterwards, depending on the explicit request of the host 1100 or the internal policy of the storage device 1200, the a-th data DTa of the user storage space UST may move to the first memory block BLK1 of the pinned turbo write buffer TWB-p. For example, the storage device 1200 may read the a-th data DTa from the third memory block BLK3 of the user storage UST and may store the read a-th data DTa in the first memory block BLK1 of the pinned turbo write buffer TWB-p. Afterwards, the a-th data DTa stored in the third memory block BLK3 of the user storage UST may be invalidated, deleted, or unmapped. In an exemplary embodiment of the inventive concept, even though the a-th data DTa are invalidated, deleted, or unmapped, an a-th logical block address LBAa corresponding to the a-th data DTa may maintain mapping with the first memory block BLK1 of the pinned turbo write buffer TWB-p.

Afterwards, the storage device 1200 may receive a read command for the a-th logical block address LBAa corresponding to the a-th data DTa from the host 1100. In this case, the storage device 1200 may read the a-th data DTa stored in the first memory block BLK1 of the pinned turbo write buffer TWB-p and may transfer the read a-th data DTa to the host 1100.

In an exemplary embodiment of the inventive concept, an operation of reading the a-th data DTa stored in the first memory block BLK1 of the pinned turbo write buffer TWB-p may be faster than an operation of reading data stored in the third memory block BLK3 of the user storage UST. In other words, the storage device 1200 according to an exemplary embodiment of the inventive concept may support a fast read operation (e.g., a turbo read operation) with regard to particular data, by storing and retaining the particular data in the turbo write buffer TWB (or the pinned turbo write buffer TWB-p).

In an exemplary embodiment of the inventive concept, the storage device 1200 may inform the host 1100 of the remaining (or free) capacity of the turbo write buffer TWB in response to a request of the host 1100. The storage device 1200 may write information about the remaining free capacity of the turbo write buffer TWB to an available turbo write buffer size field (e.g., "dAvailableTurboWriteBufferSize") of the attributes. The host 1100 may obtain capacity information of the turbo write buffer TWB by reading the available turbo write buffer size field (e.g., by using the Query UPIU).

For example, the storage device 1200 may separately record the remaining capacity of the pinned turbo write buffer TWB-p and the remaining capacity of the non-pinned turbo write buffer TWB-np at the available turbo write buffer size field. As another example, the storage device 1200 may record a total of the remaining capacity of the turbo write buffer TWB at the available turbo write buffer size field. Whether the storage device 1200 records the remaining capacity of the turbo write buffer TWB integrally or individually may be specified through flag setting of the host 1100.

For example, the storage device 1200 may record a smaller capacity than an actual free capacity of the turbo write buffer TWB at the available turbo write buffer size field. In the nonvolatile memory device 1220 such as a flash memory, in the case where a time between consecutive erase operations is smaller than a threshold time, the reliability of data may decrease.

Because the capacity of the turbo write buffer TWB is smaller than the capacity of the user storage UST and the turbo write buffer TWB is used in the SLC scheme, the turbo write buffer TWB may be filled with data more quickly than the user storage UST. In addition, in the case where the host 1100 prefers the turbo write of a high speed, the turbo write buffer TWB may be full of data more quickly.

In the case where data are intensively written in the turbo write buffer TWB, during a short time window, there are performed the following series of operations: a first erase operation is performed on the turbo write buffer TWB, data are written in the turbo write buffer TWB, the data of the turbo write buffer TWB are flushed, a second erase operation is performed on the turbo write buffer TWB, and data are written in the turbo write buffer TWB.

In this case, when a time between the first erase operation and the second erase operation is smaller than the threshold time, the reliability of data that are written in the turbo write buffer TWB after the second erase operation may decrease. To increase reliability, even though a particular memory block of the turbo write buffer TWB does not store valid data and is reusable after an erase operation, when a time passing after a previous erase operation of the particular memory block is smaller than the threshold time, the storage device 1200 may record a capacity, from which a capacity of the particular memory block is excluded, at the available turbo write buffer size field.

Figure 11:
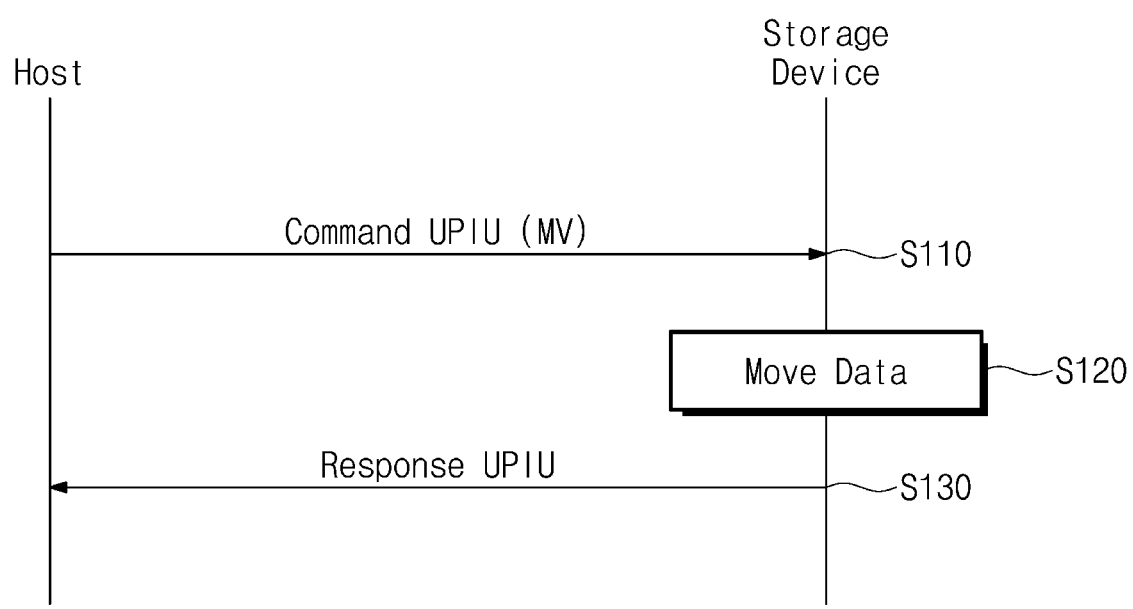
FIG. 11 is a diagram illustrating an example in which a move operation is performed at a storage system.

FIG. 11 is a diagram illustrating an example where a move operation is performed at the storage system 1000. Referring to FIGS. 1, 8, and 11, in operation S110, the host 1100 may transfer a command UPIU to the storage device 1200. The command UPIU may include move information MV (or a move command).

The command UPIU may be defined as the move command by the move information MV. The move information MV may include various information used for the move operation. Referring to operation S120, the storage device 1200 may move data requested by the move information MV in response to the command UPIU. Referring to operation S130, the storage device 1200 may complete the move read operation by transferring a response UPIU informing a result of the move operation and a result of moving data to the host 1100.

The controller 1210 may move data from an original location to the pinned turbo write buffer TWB-p, the non-pinned turbo write buffer TWB-np, or the user storage UST. For example, the controller 1210 may read move target data from the pinned turbo write buffer TWB-p, the non-pinned turbo write buffer TWB-np, or the user storage UST and may write the read move target data in the pinned turbo write buffer TWB-p, the non-pinned turbo write buffer TWB-np, or the user storage UST.

The controller 1210 may then invalidate the move target data and may map a logical address of the move target data onto a physical address of the moved data. For example, in a case where a movement destination of data is identical to an original location thereof, the controller 1210 may skip moving the data.

As described above, the turbo write buffer TWB may support a higher read speed than the user storage UST. By moving data to the turbo write buffer TWB through the move information MV, the storage device 1200 may support a function of accelerating a read speed of data.

As described above, the pinned turbo write buffer TWB-p may be free from the flush operation. Additionally, the non-pinned turbo write buffer TWB-np may be targeted for the flush operation. Accordingly, by moving data to the pinned turbo write buffer TWB-p or the non-pinned turbo write buffer TWB-np through the move information MV, the storage device 1200 may provide options to accelerate a read speed consistently or temporarily.

Also, by moving data to the user storage UST through the move information MV, the storage device 1200 may provide a function of moving cold data of a low read frequency to the user storage UST and securing a capacity of the turbo write buffer TWB. For example, the storage device 1200 may provide wide selectivity of data read to the host 1100 by supporting the movement of data through the move information MV.

For example, the storage device 1200 may record whether to support a move operation at a device descriptor. The storage device 1200 may notify the host 1100 whether the move operation is supported, by transferring the device descriptor to the host 1100. Whether the storage device 1200 performs, the move operation may be set by the host 1100.

For example, when the command UPIU includes read information, not the move information MV, the storage device 1200 may read the read target data and may output the read data to the host 1100. When the command UPIU includes write information, not the move information MV, the storage device 1200 may write the write target data received from the host 1100.

Figure 12:
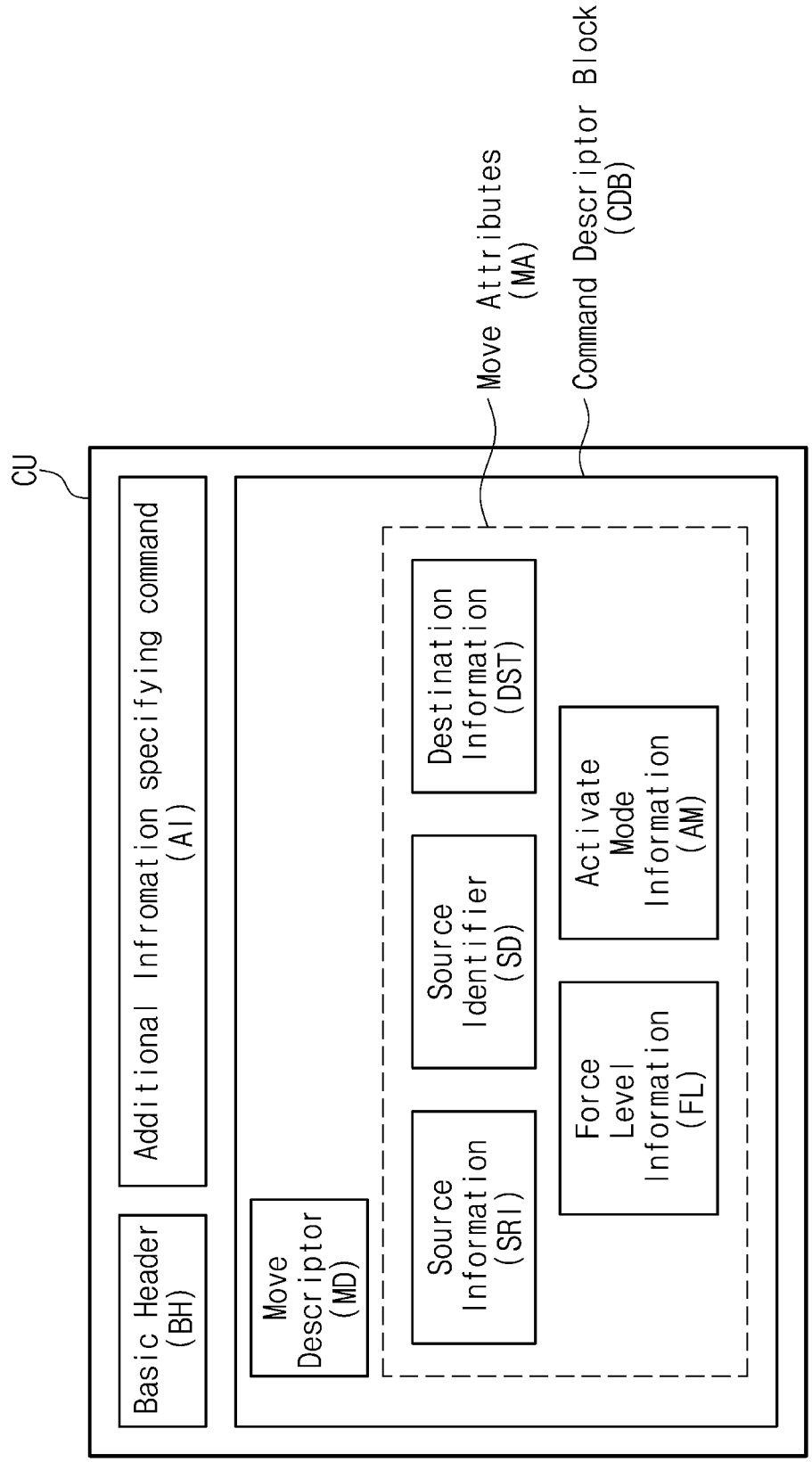
FIG. 12 illustrates an example of a command UFS Protocol Information Unit (UPIU) illustrated in FIG. 11.

FIG. 12 illustrates an example of a command UPIU CU illustrated in FIG. 11. Referring to FIG. 12, the command UPIU CU may include a basic header BH, additional information AI describing a command, and a command descriptor block CDB.

The basic header BH may include a transaction type (e.g., "xx000001b") defined by the UFS protocol, FLAGs, a logical unit number (LUN), a task tag, an initiator ID (IID), a command set type, a total EHS (Extra Header Segment) length, a data segment length (e.g., "00h"), an expected data transfer length (e.g., "0000h").

The additional information AI may include an expected data transfer length. The command descriptor block CDB may include a move descriptor MD as the move information MV and may include move attributes MA. The move attributes MA may be included in the move information MV together with the move descriptor MD. For example, a type of the move information MV and information included therein may be defined by the UFS protocol.

The move information MA may describe ways to move data. For example, the move attributes MA may include at least one of source information SRI, a source identifier SD, destination information DST, force level information FL, and activate mode information AM. The storage device 1200 may move the move target data, based on the move attributes MA. Each of the move attributes MA will be more fully detailed below.

For example, whether to use each of the source information SRI, the source identifier SD, the destination information DST, the force level information FL, and the activate mode information AM as the move attributes MA may be specified by the host 1100 through settings.

Additionally, the storage device 1200 may record whether to support each of the source information SRI, the source identifier SD, the destination information DST, the force level information FL, and the activate mode information AM as the move attributes MA, at the device descriptor. The storage device 1200 may notify the host 1100 whether to support the respective move attributes MA, by transferring the device descriptor to the host 1100.

Figure 13:
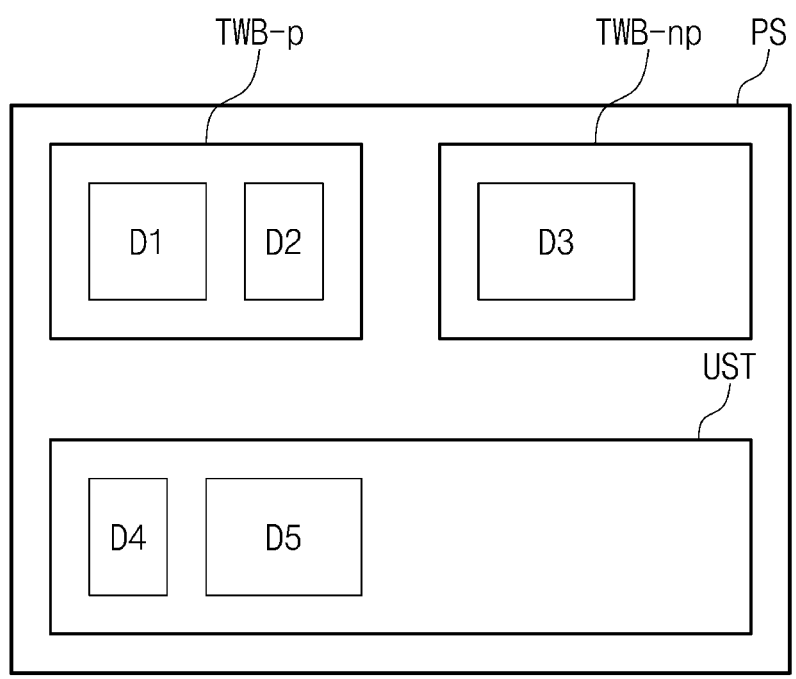
FIG. 13 illustrates an example of data stored in a pinned turbo write buffer, a non-pinned turbo write buffer, and user storage.

FIG. 13 illustrates an example of data stored in the pinned turbo write buffer TWB-p, the non-pinned turbo write buffer TWB-np, and the user storage UST. Referring to FIGS. 1, 12, and 13, the pinned turbo write buffer TWB of the physical storage space PS may store first data D1 and second data D2.

The non-pinned turbo write buffer TWB-np may store third data D3. The user storage UST may store fourth data D4 and fifth data D5. The source information SRI and the source identifier SD indicate information about move target data. The source information SRI may include information about a type of the source identifier SD, and the source identifier SD may indicate the move target data in the form specified by the source information SRI.

For example, the source information SRI may indicate a logical address as the type of the source identifier SD, and the source identifier SD may include a logical address(es) of the move target data. For example, the command UPIU CU, including the move information MV may specify and move the move target data based on a logical address.

The source information SRI may indicate an area as the type of the source identifier SD, and the source identifier SD may indicate one of the pinned turbo write buffer TWB-p, the non-pinned turbo write buffer TWB-np, and the user storage UST. For example, the command UPIU CU, including the move information MV may move data stored in the pinned turbo write buffer TWB-p, the non-pinned turbo write buffer TWB-np, or the user storage UST to another area.

The source information SRI may indicate a group number as the type of the source identifier SD, and the source identifier SD may include a group number of the move target data. The group number GN may be a number that the host 1100 randomly gives to data in a write operation of data to distinguish data of similar contexts. For example, the command UPIU CU including the move information MV may specify and move the move target data based on a group number.

Alternatively, the source information SRI may indicate at least two of a logical address, an area, and a group number as the type of the source identifier SD. The source identifier SD may indicate at least two of a logical address, an area, and a group number. The storage device 1200 may specify pieces of data coinciding with the at least two source identifiers as the move target data.

For example, when the source identifier SD includes a logical address and an area, data that have the logical address specified by the source identifier SD in the area specified by the source identifier SD may be identified as the move target data. For example, the command UPIU CU including the move information MV may specify and move the move target data with a combination of at least two attributes.

The destination information DST may indicate one of the pinned turbo write buffer TWB-p, the non-pinned turbo write buffer TWB-np, and the user storage UST. The storage device 1200 may move the move target data specified by the source information SRI and the source identifier SD to a destination area specified by the destination information DST.

For example, in a case where the move target data is already stored in the destination area, the storage device 1200 may skip the move operation. In a case where partial data of the move target data have been stored in the destination area, the storage device 1200 may move the remaining partial data of the move target data to the destination area.

Based on the instructions of the move information MV, the storage device 1200 may move data from the pinned turbo write buffer TWB-p to the non-pinned turbo write buffer TWB-np, from the pinned turbo write buffer TWB-p to the user storage UST, from the non-pinned turbo write buffer TWB-np to the pinned turbo write buffer TWB-p, from the non-pinned turbo write buffer TWB-p to the user storage UST, from the user storage UST to the pinned turbo write buffer TWB-p, or from the user storage UST to the non-pinned turbo write buffer TWB-np.

As the data are moved, the storage device 1200 may map a logical address of the move target data onto a physical address of the moved destination area. By maintaining the logical address of the move target data, the storage device 1200 may move data internally and may support the access using the same logical address to the host 1100. Accordingly, this data movement may not cause an additional load of the host 1100.

For example, the destination information DST may be provided by using not a logical address but information of an area (e.g., the pinned turbo write buffer TWB-p, the non-pinned turbo write buffer TWB-np, or the user storage UST). The storage device 1200 may reduce the load of the host 1100 by moving data internally based on the information of the destination area.

The storage device 1200 may inform the host 1100 whether data belongs to any area, based on a request (e.g., a query request) of the host 1100. For example, the storage device 1200 may automatically move data such that the load of the host 1100 decreases and may allow the host 1100 to track a location of the data.

Figure 14:
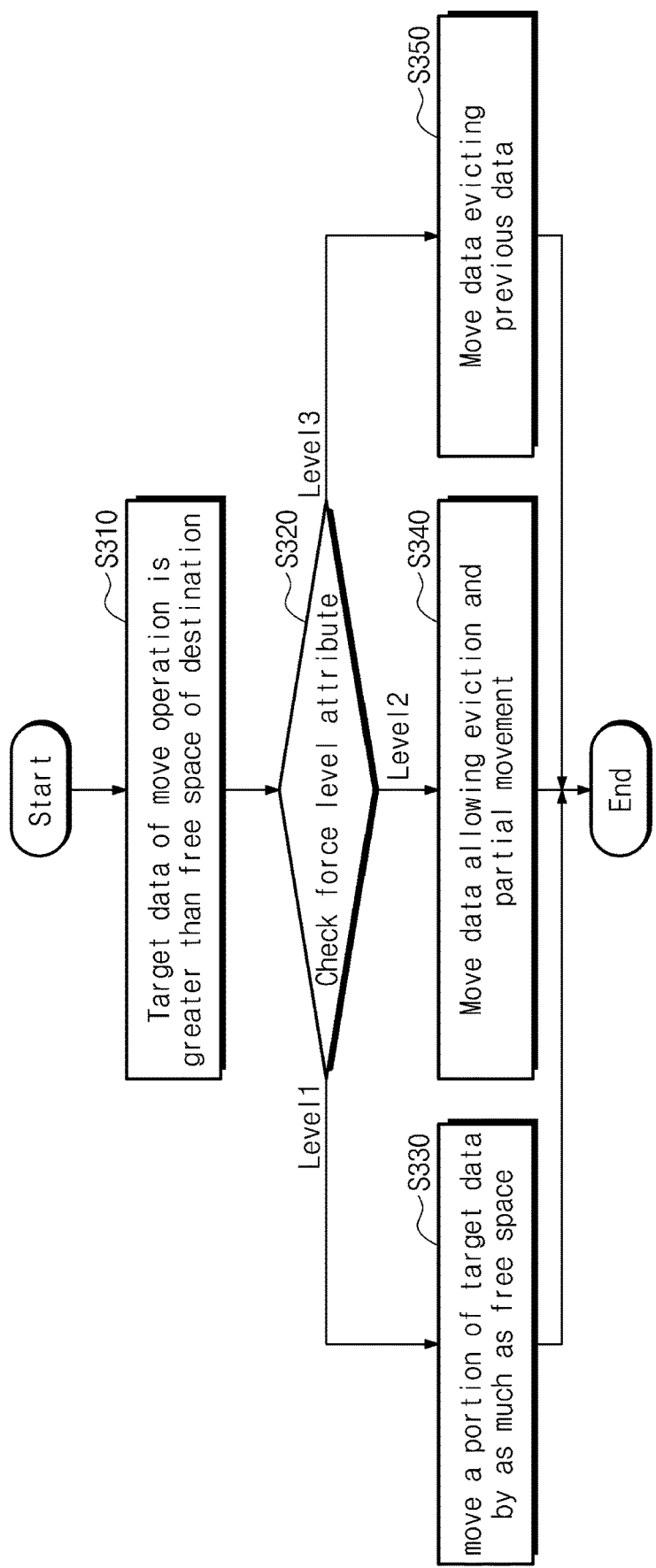
FIG. 14 illustrates an example in which a storage device moves data based on force level information.

FIG. 14 illustrates an example in which the storage device 1200 moves data based on the force level information FL. Referring to FIGS. 1, 12, and 14, in operation S310, target data of a move operation (e.g. data identified by the source information SRI and the source identifier SD of the command UPIU) may be greater than a free space (or capacity) of a destination area. In this case, referring to operation S320, the storage device 1200 may check the force level information FL of the move attributes MA.

When a force level is a first level, operation S330 is performed. Referring to operation S330, the storage device 1200 may move a portion of data as much as the free capacity of the destination area. The storage device 1200 may be prohibited from evicting data that may be stored in the destination area.

When the force level is a second level, operation S340 is performed. Referring to operation S340, the storage device

1200 may be allowed to evict the data stored in the destination area and may be allowed to move a portion of the data being the move target and to leave the remaining portion at an original location.

For example, a quantity or ratio of data to be evicted, the quantity or ratio of move target data to be moved, and the quantity or ratio of move target data to be left may be determined in compliance with the force level policy. For example, the force level information FL may include information of the force level policy. For another example, the force level policy may be set or changed by a request (e.g., a query request) of the host 1100.

When the force level is a third level, operation S350 is performed. Referring to operation S350, the storage device 1200 may evict the data of the target area and may move the move target data to the destination area.

As described above, based on the force level information FL, the storage device 1200 move a portion of the move target data and may maintain the remaining portion at an original location. The storage device 1200 may map a logical address of the partial data that may be moved onto a physical address of the destination area.

The storage device 1200 may invalidate the partial data, which are moved to the destination area, of the move target data. The storage device 1200 may maintain, as valid data, the remaining partial data, which are not moved and are left at the original location, of the move target data and may maintain mapping between a logical address and a physical address of the remaining partial data.

As described above, based on the force level information FL, the storage device 1200 evicts the data stored in the destination area. The evicted data may be moved to the user storage UST or the non-pinned turbo write buffer TWB-np, based on default settings. For another example, a location to which the data are to be evicted may be included in the force level information FL based on the force level policy.

For example, the movement according to the force level information FL of FIG. 14 may be applied when the destination area is the pinned turbo write buffer TWB-p or the non-pinned turbo write buffer TWB-np. A situation that a free space of the user storage UST is great may mean an out-of-capacity, and a command may be denied at the host 1100 or at the storage device 1200.

Figure 15:
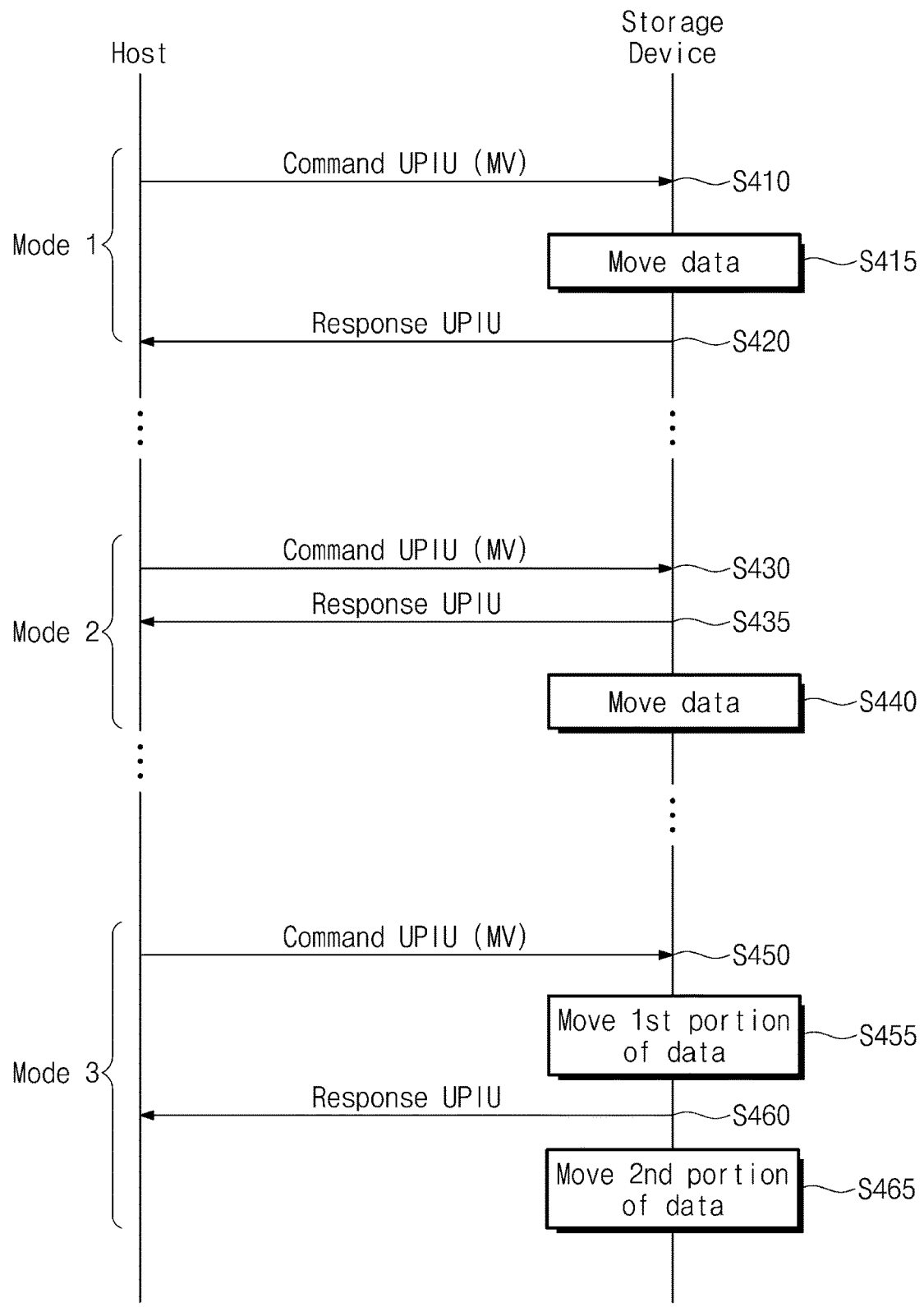
FIG. 15 illustrates examples in which a storage device moves data based on activate mode information.

FIG. 15 illustrates examples in which the storage device 1200 moves data based on activate mode information AM. Referring to FIGS. 1, 12, and 15, the activate mode information AM may indicate a time at which the storage device 1200 moves data.

When the activate mode information AM indicates a first mode, the storage device 1200 may perform operation S410 to operation S420. Referring to operation S410, the storage device 1200 may receive the command UPIU including the move information MV from the host 1100. Additionally, referring to operation S415, the storage device 1200 may move the move target data in response to the move information MV of the command UPIU. Referring to operation S420, the storage device 1200 may transfer the response UPIU to the command UPIU.

For example, when the activate mode information AM indicates the first mode, the storage device 1200 may move data before transferring the response UPIU to the host 1100. Alternatively, when the activate mode information AM indicates the first mode, the storage device 1200 may start to move data before transferring the response UPIU to the host 1100. The storage device 1200 may transfer the response UPIU to the host 1100 while moving data (or at the same time when the data are moved).

When the activate mode information AM indicates a second mode, the storage device 1200 may perform operation S430 to operation S440. Referring to operation S430, the storage device 1200 may receive the command UPIU including the move information MV from the host 1100. Additionally, referring to operation S435, the storage device 1200 may transfer the response UPIU to the command UPIU. Referring to operation S440, the storage device 1200 may move data in response to the move information MV of the command UPIU. For example, when the activate mode information AM indicates the second mode, the storage device 1200 may move data after transferring the response UPIU to the host 1100.

When the activate mode information AM indicates a third mode, the storage device 1200 may perform operation S450 to operation S465. Referring to operation S450, the storage device 1200 may receive the command UPIU including the move information MV from the host 1100. Additionally, referring to operation S455, the storage device 1200 may move a first portion of the move target data in response to the move information MV of the command UPIU. Referring to operation S460, the storage device 1200 may transfer the response UPIU to the command UPIU.

Referring to operation S465, the storage device 1200 may move a second portion of the move target data in response to the move information MV of the command UPIU. For example, when the activate mode information AM indicates the third mode, the storage device 1200 may partially move the move target data before and after transferring the response UPIU to the host 1100.

The activate mode information AM may be determined in consideration of an operating speed of the storage device 1200, a timeout time of a read operation promised between the host 1100 and the storage device 1200, etc.

Thus, according to an exemplary embodiment a method of data storage may include: receiving a move command (i.e., the command UPIU) from an external host device, wherein the move command specifies data to be moved within a nonvolatile memory device between a turbo write buffer and a user storage area; identifying an activate mode based on the move command; moving the data at a first time, wherein the first time is based on the activate mode; and transmitting a response (i.e. the response UPIU) to the external host device at a second time, wherein the second time is based on the activate mode.

In some cases, the activate mode comprises one from a set consisting of: a first mode to transmit the response to the external host device after moving the data; a second mode to move the data after transmitting the response to the external host device; and a third mode to move a first portion of the data, to transmit the response to the external host device, and then to move a second portion of the data.

Figure 16:
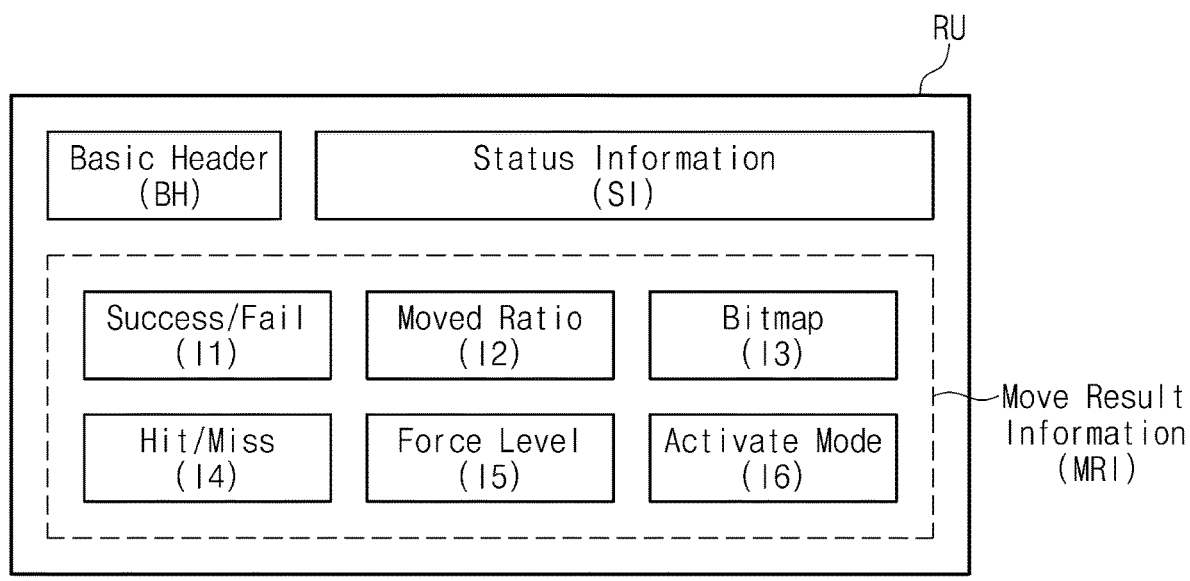
FIG. 16 illustrates an example of a response UPIU of FIG. 11.

FIG. 16 illustrates an example of the response UPIU RU of FIG. 11. Referring to FIGS. 1 and 16, the response UPIU may include at least one of the basic header BH, status information SI including a result of a read operation, and move result information MRI including a result of a move operation.

The move result information MRI may include first to sixth information I1 to I6. The first information I1 may indicate whether a move operation a success or a failure. The second information I2 may indicate a ratio of data moved through the move operation (i.e., a ratio for move target data).

The third information I3 may include a bitmap indicating a location of data after the move operation. The fourth information I4 may indicate that all or a portion of the move target data are already stored (i.e., a hit occurs) or that the move target data are not stored (i.e., a miss occurs). The fifth information I5 may indicate the force level information FL applied to the move operation. The sixth information I6 may include the activate mode information AM applied to the move operation.

As described with reference to the second mode and the third mode of FIG. 15, the move operation of data may not be completed at a time to transfer the response UPIU RU. In this case, the controller 1210 may include an expected result of the move operation in the response UPIU RU as the move result information MRI.

For example, the first information I1 may indicate the expected result instead of a success or a failure. The second information I2 and the third information I3 may include expected results that are calculated (or determined) by the controller 1210 based on the move attributes MA. The fourth information I4 may determine a time at which the controller 1210 receives the source information SRI, the source identifier SD, and the destination information DST of the move attributes MA. The fifth information I5 and the sixth information I6 may be checked by the controller 1210 from the move attributes MA.

After the move operation is completed, the storage device 1200 may record at least one of the first to sixth information I1 to I6 of the move result information MRI at move feedback attributes. The storage device 1200 may transfer the move feedback attributes to the host 1100 in response to a request (e.g., a query request) of the host 1100.

Figure 17:
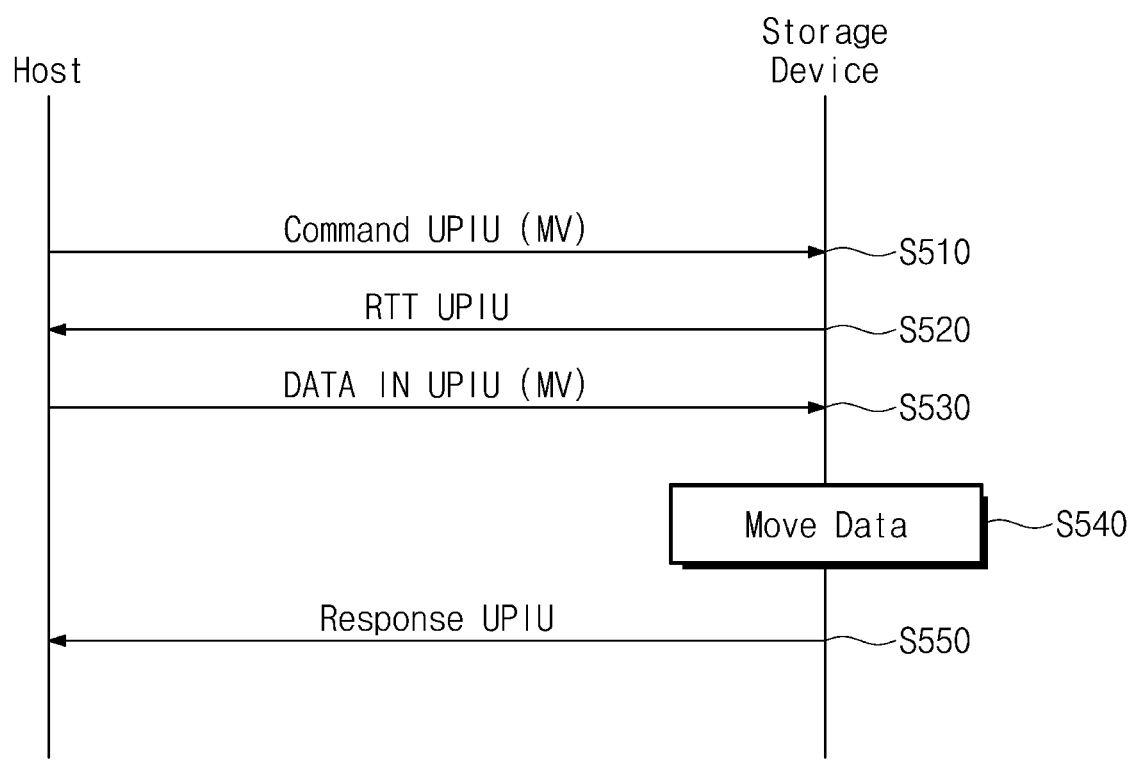
FIGS. 17 and 18 illustrate an example in which a storage device performs a move operation in response to a command UPIU and a DATA OUT UPIU.
Figure 18:
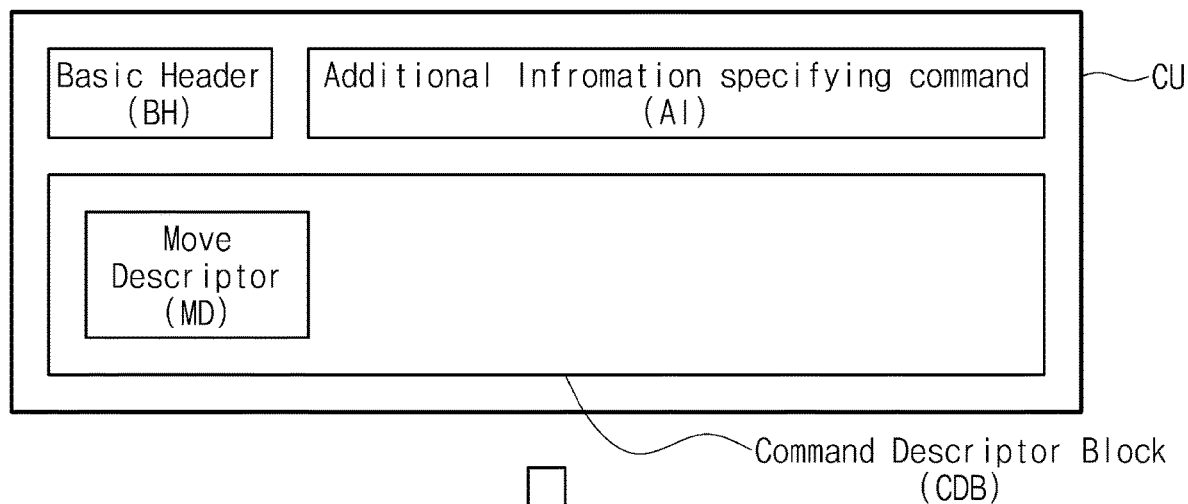
Figure 18:
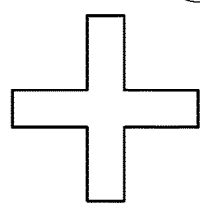
Figure 18:
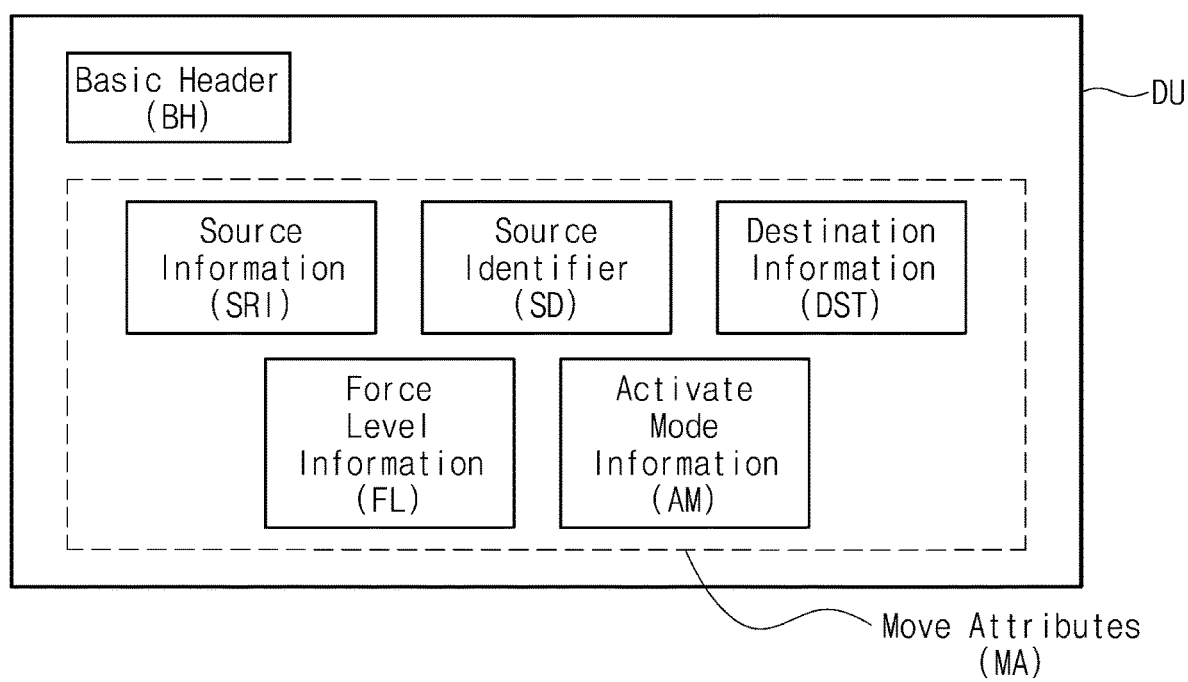

FIGS. 17 and 18 illustrate an example in which the storage device 1200 performs a move operation in response to the command UPIU CU and the DATA OUT UPIU DU. Referring to FIGS. 17 and 18, in operation S510, the storage device 1200 may receive the command UPIU CU including the move information MV from the host 1100. The command UPIU CU may include the basic header BH and the additional information AI and may include the move descriptor as the move information MV in the command descriptor block CDB.

When the storage device 1200 is ready to receive data, the storage device 1200 may transfer the RTT UPIU to the host 1100. In response to the RTT UPIU, the host 1100 may transfer the DATA OUT UPIU DU to the storage device 1200. The DATA OUT UPIU DU may include the basic header BH and may include the move attributes MA as the move information MV. The move attributes MA may include at least one of the source information SRI, the source identifier SD, the destination information DST, the force level information FL, and the activate mode information AM.

For example, the storage device 1200 may operate in a first mode where the move information MV is received through the command UPIU as described with reference to FIG. 11 and a second mode where the move information MV is received through the command UPIU and the DATA OUT UPIU DU as described with reference to FIG. 17. The storage device 1200 may record whether to support any of the first mode and second mode at the device descriptor and may transfer the device descriptor to the host 1100.

Depending on the settings of the host 1100, the storage device 1200 may be specified to operate in the first mode, the second mode, or a mixed-mode where both the first mode and the second mode are allowed.

Figure 19:
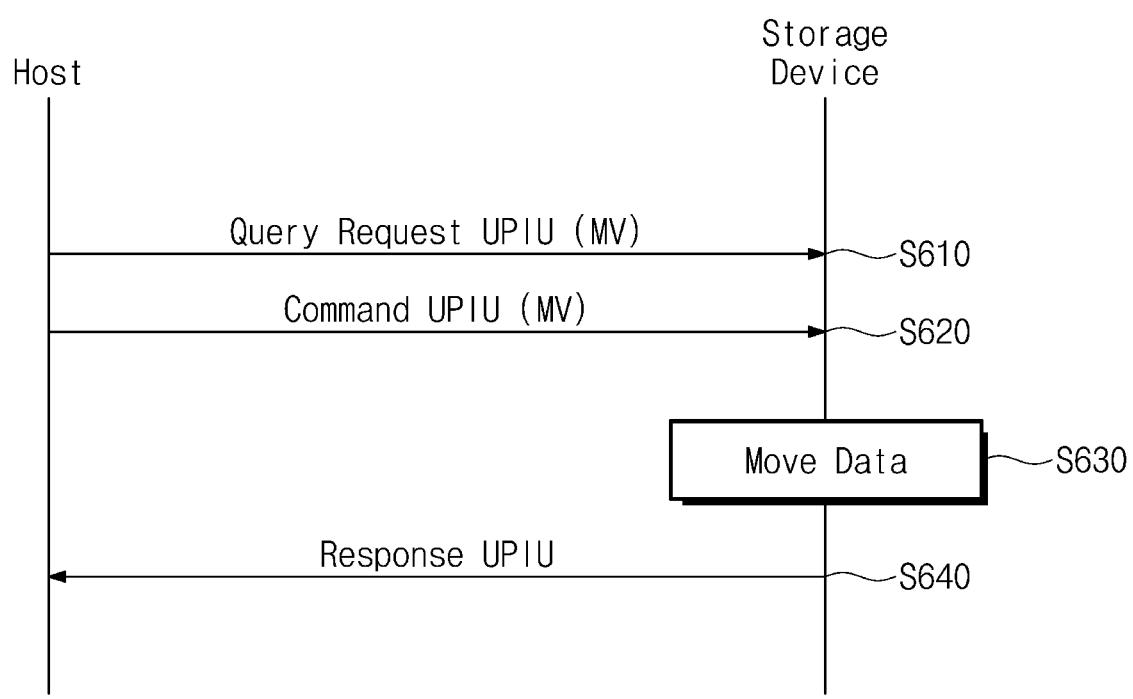
FIGS. 19 and 20 illustrate an example in which a storage device performs a move operation of data in combination of a query request UPIU QU and a command UPIU.
Figure 20:
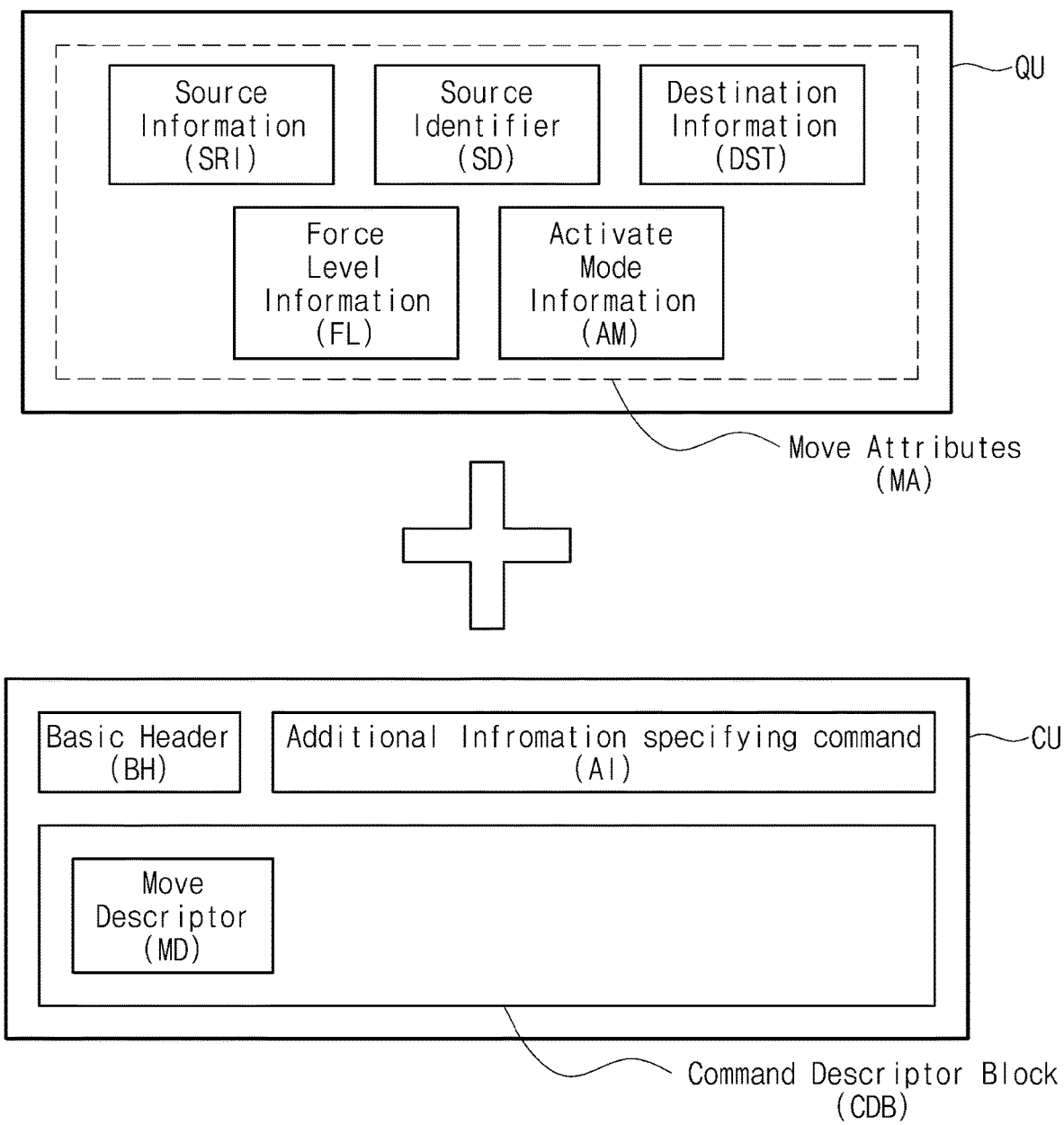

FIGS. 19 and 20 illustrate an example in which the storage device 1200 performs a move operation of data using a combination of a query request UPIU QU and the command UPIU. Referring to FIGS. 19 and 20, in operation S610, the storage device 1200 may receive the query request UPIU QU including the move information MV. The query request UPIU QU may include the move attributes MA as the move information MV. The move attributes MA may include at least one of the source information SRI, the source identifier SD, the destination information DST, the force level information FL, and the activate mode information AM.

Following the query request UPIU QU, referring to operation S620, the storage device 1200 may receive the command UPIU CU. The command UPIU CU may include the basic header BH, the additional information AI, and the command descriptor block CDB. The command descriptor block CDB may include the move descriptor MD as the move information MV.

Referring to operation S630, the storage device 1200 may perform a move operation based on the move attributes MA in response to the command UPIU. Referring to operation S640, the storage device 1200 may transfer the response UPIU to the host 1100.

For example, the storage device 1200 may communicate other UPIUs with the host 1100 between operation S610 in which the query request UPIU QU is received and operation S620 in which the command UPIU CU is received. For example, after the storage device 1200 sets the move attributes MA, the host 1100 may direct the move operation to the storage device 1200 when there is no need to access the storage device 1200.

For example, as described with reference to FIG. 16, a time of the move operation of data and a time to transfer the response UPIU may vary based on the activate mode information AM. Also, the response UPIU may be configured based on the description given with reference to FIG. 16.

For example, two or more move attributes MA may be set by two or more query request UPIUs. The command UPIU may specify one of the two or more move attributes MA. The storage device 1200 may perform the move operation depending on the move attributes MA that the command UPIU specifies.

For another example, the command UPIU may specify two or more move attributes MA or may not specify move attributes MA. The storage device 1200 may perform two or more move operations based on the two or more move attributes MA that are set.

As described with reference to FIGS. 17 and 18, the storage device 1200 may support at least two modes of the first mode described with reference to FIG. 11, the second mode described with reference to FIGS. 17 and 18, and the third mode described with reference to FIGS. 19 and 20 or a mixed-mode of at least two modes thereof. The storage device 1200 may record the supported modes at the device descriptor and may transfer the device descriptor to the host 1100. The storage device 1200 may be configured to accommodate a mode or modes based on settings of the host 1100.

As a first scheme for moving data in response to the command UPIU including the move information MV (or a move command), the storage device 1200 may receive the move attributes MA through the command UPIU as described with reference to FIG. 12 or may receive the move attributes MA through the DATA OUT UPIU as described with reference to FIG. 18. The move attributes MA may be single-use attributes and may trigger an immediate (or prompt) move operation.

As a second scheme, as described with reference to FIG. 20, the storage device 1200 may receive the move attributes MA through the query request UPIU. The move attributes MA included in the query request UPIU may be applied to a move operation that may be performed in response to the command UPIU including the move descriptor MD as the move information MV.

Figure 21:
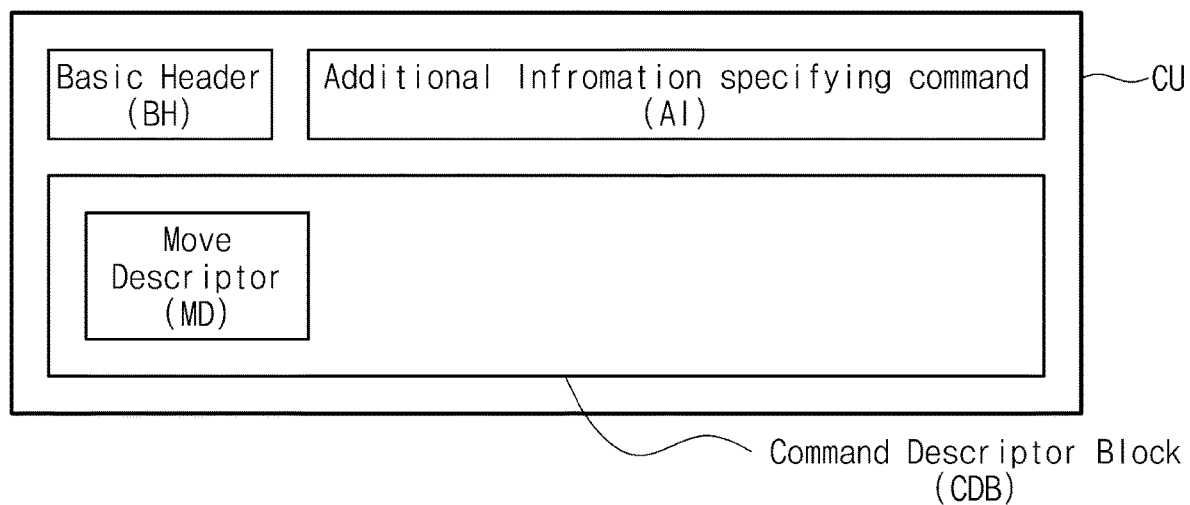
FIG. 21 illustrates another example of a command UPIU illustrated in FIG. 12.

FIG. 21 illustrates another example of the command UPIU CU illustrated in FIG. 12. Referring to FIGS. 1, 8, 12, and 21, the command UPIU CU may include the basic header BH, the additional information AI, and the command descriptor block CDB. The command descriptor block CDB may include the move descriptor MD as the move information MV.

Move attributes of a move operation may be defined when the storage device 1200 is manufactured or may be specified by the host 1100. The move attributes include a source area(s) and a destination area. In response to the command UPIU CU, the storage device 1200 may move data of a predefined source area(s) to the destination area.

For example, the source area(s) may include the pinned turbo write buffer TWB-p, the non-pinned turbo write buffer TWB-np, or both. The destination area may include the user storage UST. The complexity of the move operation may decrease by simplifying the move attributes and the move information MV used for the move operation.

Figure 22:
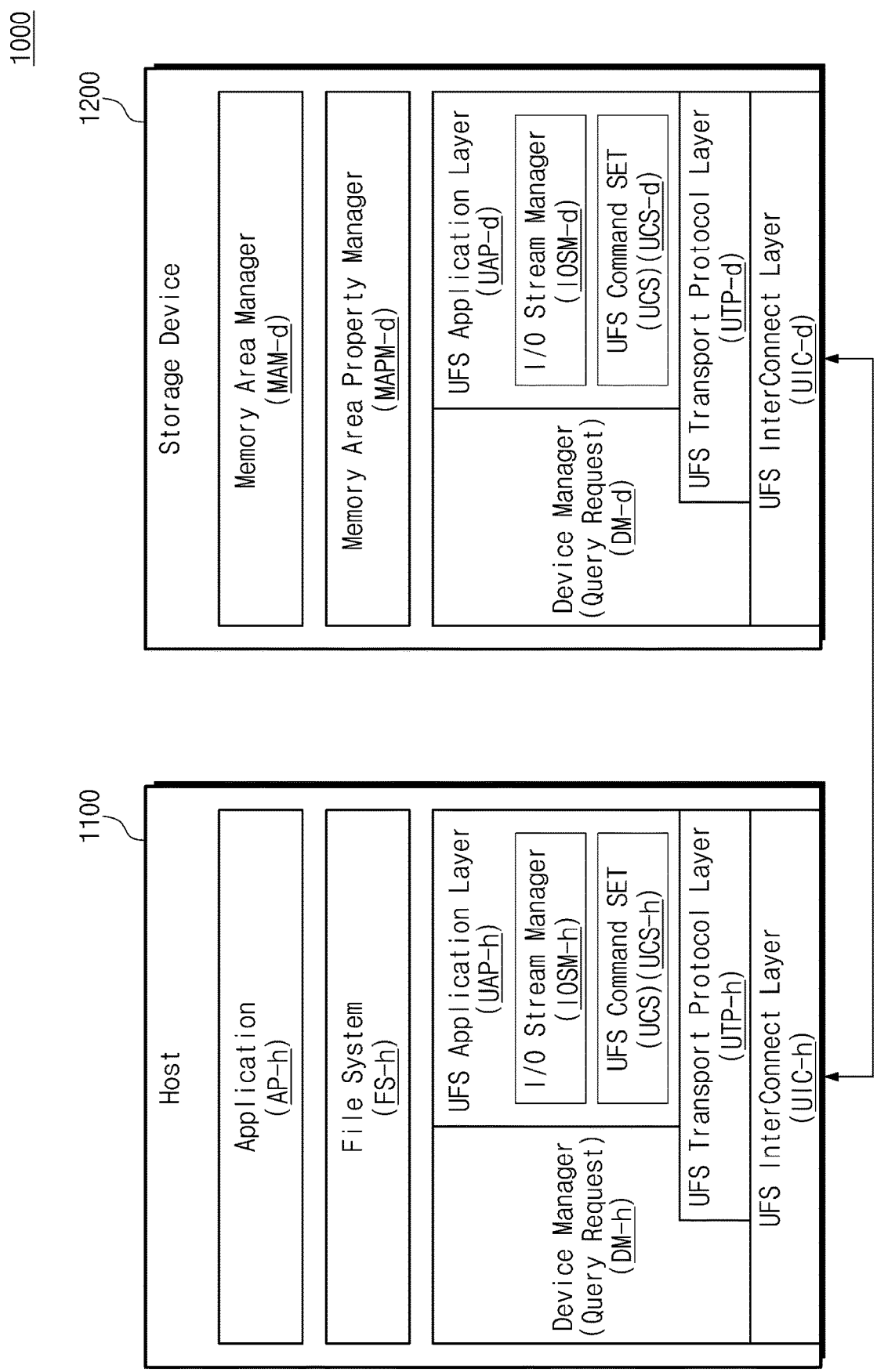
FIG. 22 is a diagram illustrating a hierarchical structure of a storage system of FIG. 1.

FIG. 22 is a diagram illustrating a hierarchical structure of the storage system 1000 of FIG. 1. Referring to FIG. 22, the storage system 1000 may include the host 1100 and the storage device 1200. The host 1100 may include an application AP-h, a file system FS-h, a device manager DM-h, a UFS application layer UAP-h, a UFS transport protocol layer UTP-h, and a UFS interconnect layer UIC-h.

The application AP-h may include various application programs, processes, etc. that are driven at the host 1100. The file system FS-h may be configured to organize and manage a variety of data generated by the application AP-h. In an exemplary embodiment of the inventive concept, the application AP-h or the file system FS-h may be configured to determine a logical block address range to specify a logical block address range for a particular area. Information about the determined logical block address range may be provided to a lower layer (e.g., the device manager DM-h or the UFS application layer UAP-h).

The UFS application layer UAP-h is configured to support various commands between the host 1100 and the storage device 1200. For example, the UFS application layer UAP-h may include an input/output (I/O) stream manager IOSM-h and a UFS command set UCS-h. The I/O stream manager IOSM-h is configured to manage a request from the application AP-h or the file system FS-h.

In an exemplary embodiment of the inventive concept, the I/O stream manager IOSM-h may be configured to identify a particular value of an input/output from the application AP-h or the file system FS-h. The I/O stream manager IOSM-h may be configured to manage a priority of a request from the application AP-h or the file system FS-h or to support various functions according to the request from the application AP-h or the file system FS-h. In an exemplary embodiment of the inventive concept, the I/O stream manager IOSM-h may be configured to support the turbo write function or the turbo read function.

In an exemplary embodiment of the inventive concept, a particular application or process specified by the host 1100 or a user of the host 1100 may use the turbo write or the turbo read. The I/O stream manager IOSM-h may determine whether to perform the turbo write or the turbo read in response to a write or read request that is made by the particular application or process with regard to the storage device 1200.

In addition, particular data that are managed by the file system FS-h may use the turbo write or the turbo read. The I/O stream manager IOSM-h may determine whether to perform the turbo write or the turbo read in response to the write or read request for the storage device 1200 with regard to particular data (e.g., meta data).

In addition, the I/O stream manager IOSM-h may direct a move of data written in the storage device 1200. The I/O stream manager IOSM-h may adjust a read speed of data written in the storage device 1200 by moving data to the pinned turbo write buffer TWB-p, the non-pinned turbo write buffer TWB-np, or the user storage UST.

In an exemplary embodiment of the inventive concept, the I/O stream manager IOSM-h may determine an area (e.g., the pinned turbo write buffer TWB-p, the non-pinned turbo write buffer TWB-np, or the user storage UST) in which particular data are to be stored depending on attributes of the particular data and may provide information about the determination (e.g., the area information ARI) to the UFS command set UCS-h.

In an exemplary embodiment of the inventive concept, the I/O stream manager IOSM-h may determine a logical block address, at which the particular data are to be stored, based on the attributes of the particular data and a predetermined logical block address range and may provide information about the determined logical block address range to the UFS command set UCS-h.

The UFS command set UCS-h may support various command sets that are supported between the host 1100 and the storage device 1200. In an exemplary embodiment of the inventive concept, the UFS command set UCS-h may include a UFS native command set and a UFS SCSI command set. The UFS command set UCS-h may configure a command to be transferred to the storage device 1200 depending on a request from the application AP-h or the file system FS-h.

In an exemplary embodiment of the inventive concept, the UFS command set UCS-h may be configured to receive various information (e.g., a logical block address, area information, a logical block address range, or range area information) from the I/O stream manager IOSM-h and to generate various commands.

The UFS application layer UAP-h may further include a task manager that processes commands for a control of a command queue.

The device manager DM-h may manage operations of a device level and configurations of a device level. In an exemplary embodiment of the inventive concept, the device manager DM-h may manage a query request for setting or checking various information of the storage device 1200.

The UFS transport protocol layer UTP-h may provide services for an upper layer. The UFS transport protocol layer UTP-h may generate a command or information provided from the UFS application layer UAP-h, or a query request provided from the device manager DM-h in the form of a UPIU (UFS Protocol Information Unit) packet.

In an exemplary embodiment of the inventive concept, the UFS transport protocol layer UTP-h and the device manager DM-h may communicate with each other through a UDM-SAP (UDM-Service Access Point). The UFS transport protocol layer UTP-h and the UFS application layer UAP-h may communicate with each other through a UTP_CMD_SAP or a UTP_TM_SAP.

The UFS interconnect layer UIC-h may manage a connection with the storage device 1200. In an exemplary embodiment of the inventive concept, the UFS interconnect layer UIC-h may include hardware configurations such as an MIPI Unipro or an MIPI M-PHY physically connected with the UFS interconnect layer UIC-d of the storage device 1200. This way the host 1100 and storage device 1200 can establish a communication channel with each other. In an exemplary embodiment of the inventive concept, the UFS interconnect layer UIC-h and the UFS transport protocol layer UTP-h may communicate through a UIC-SAP, and the UFS interconnect layer UIC-h and the device manager DM-h may communicate through a UIO-SAP.

The storage device 1200 may include a memory area manager MAM-d, a memory area property manager MAPM-d, a device manager DM-d, a UFS application layer UAP-d, a UFS transport protocol layer UTP-d, and a UFS interconnect layer UIC-d. In an exemplary embodiment of the inventive concept, a configuration of the UFS application layer UAP-d, the UFS transport protocol layer UTP-d, and the UFS interconnect layer UIC-d may be similar to that of the UFS application layer UAP-h, the UFS transport protocol layer UTP-h, and the UFS interconnect layer UIC-h of the host 1100 and allows corresponding layers to logically communicate with each other, and thus, additional description will be omitted to avoid redundancy.

The memory area property manager MAPM-d of the storage device 1200 may specify and manage an area where write data received from the host 1100 are to be stored. For example, as described above, depending on the explicit request of the host 1100 or the internal policy, the write data received from the host 1100 may be written in a space of at least one of the pinned turbo write buffer TWB-p, the non-pinned turbo write buffer TWB-np, and the user storage UST. The memory area property manager MAPM-d may select a space, in which the write data received from the host 1100 are to be stored, based on the various schemes described above and may store the write data in the selected space.

As described above, depending on the explicit request of the host 1100 or the internal policy, the memory area manager MAM-d of the storage device 1200 may control data move/flush/migration between the pinned turbo write buffer TWB-p, the non-pinned turbo write buffer TWB-np, and the user storage UST.

The above hierarchical structure and function of each of the host 1100 and the storage device 1200 is merely exemplary, and the inventive concept is not limited thereto.

Figure 23:
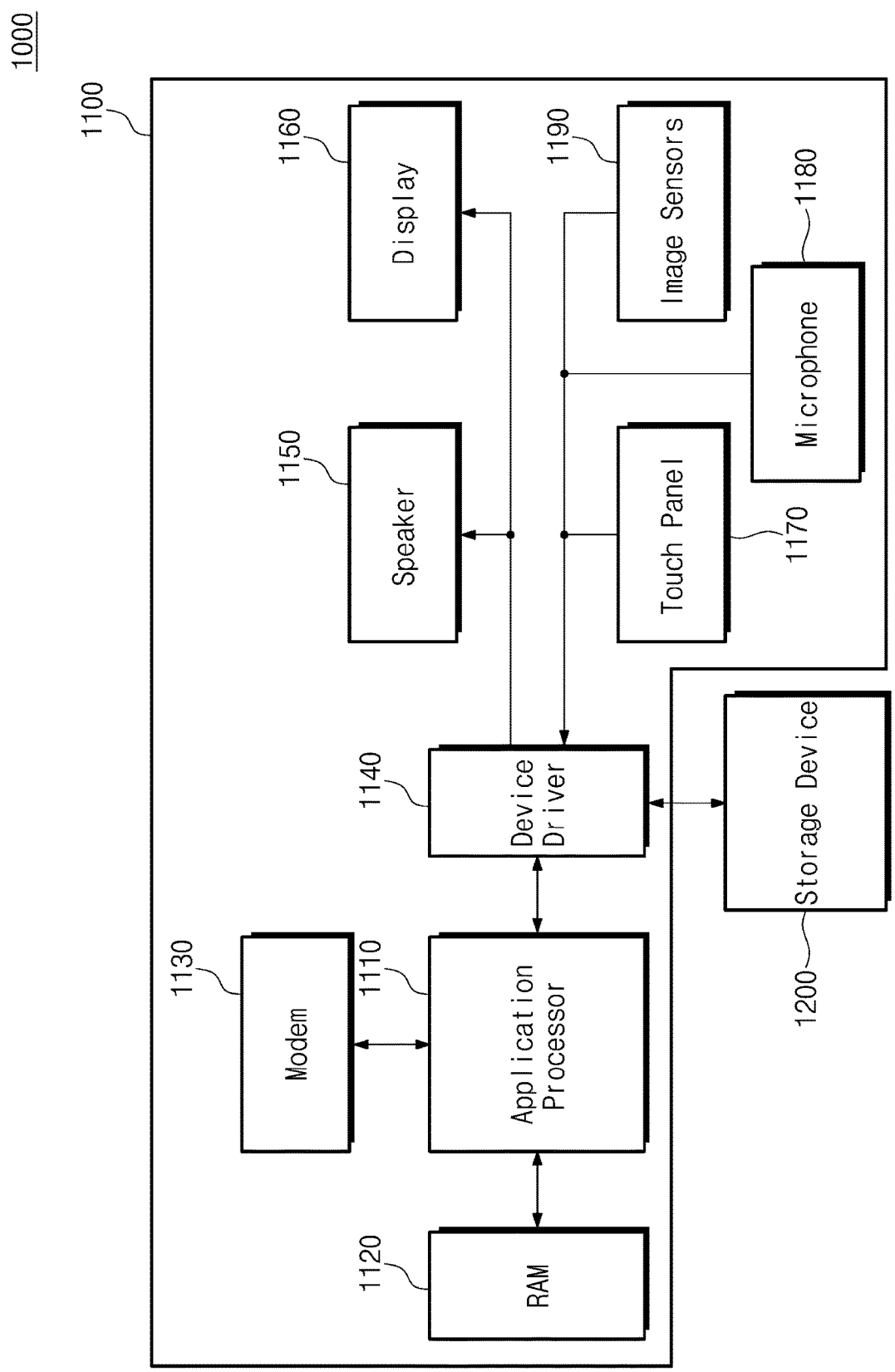
FIG. 23 is a block diagram illustrating a storage system according to an embodiment of the inventive concept in detail.

FIG. 23 is a block diagram illustrating the storage system 1000 according to an exemplary embodiment of the inventive concept in detail. Referring to FIGS. 22 and 23, the storage system 1000 may include the host 1100 and the storage device 1200. The host 1100 and the storage device 1200 may operate as described with reference to FIGS. 1 to 21.

The host 1100 may include an application processor 1110, a random access memory (RAM) 1120, a modem 1130, a device driver 1140, a speaker 1150, a display 1160, a touch panel 1170, a microphone 1180, and image sensors 1190.

The application processor 1110 may execute the application AP-h and the file system FS-h. The application processor 1110 may use the RAM 1120 as a system memory. The application processor 1110 may communicate with an external device through the modem 1130 in a wired fashion or wirelessly. For example, the modem 1130 may be embedded in the application processor 1110.

The application processor 1110 may communicate with peripheral devices through the device driver 1140. For example, the application processor 1110 may communicate with the speaker 1150, the display 1160, the touch panel 1170, the microphone 1180, the image sensors 1190, and the storage device 1200 through the device driver 1140.

The device driver 1140 may include the device manager DM-h, the UFS application layer UAP-h, the UFS transport protocol layer UTP-h, and the UFS interconnect layer UIC-h. For example, the device driver 1140 may be embedded in the application processor 1110.

The speaker 1150 and the display 1160 may be user output interfaces that transfer information to the user. The touch panel 1170, the microphone 1180, and the image sensors 1190 may be user input interfaces that receive information from the user.

In an exemplary embodiment of the inventive concept, the storage device 1200 may be used as a high-capacity storage medium of the host 1100. The storage device 1200 may be an embedded type of UFS device or a memory card type of UFS device. The UFS device of the memory card type may be inserted into or detached from an UFS slot included in the host 1100.

Figure 24:
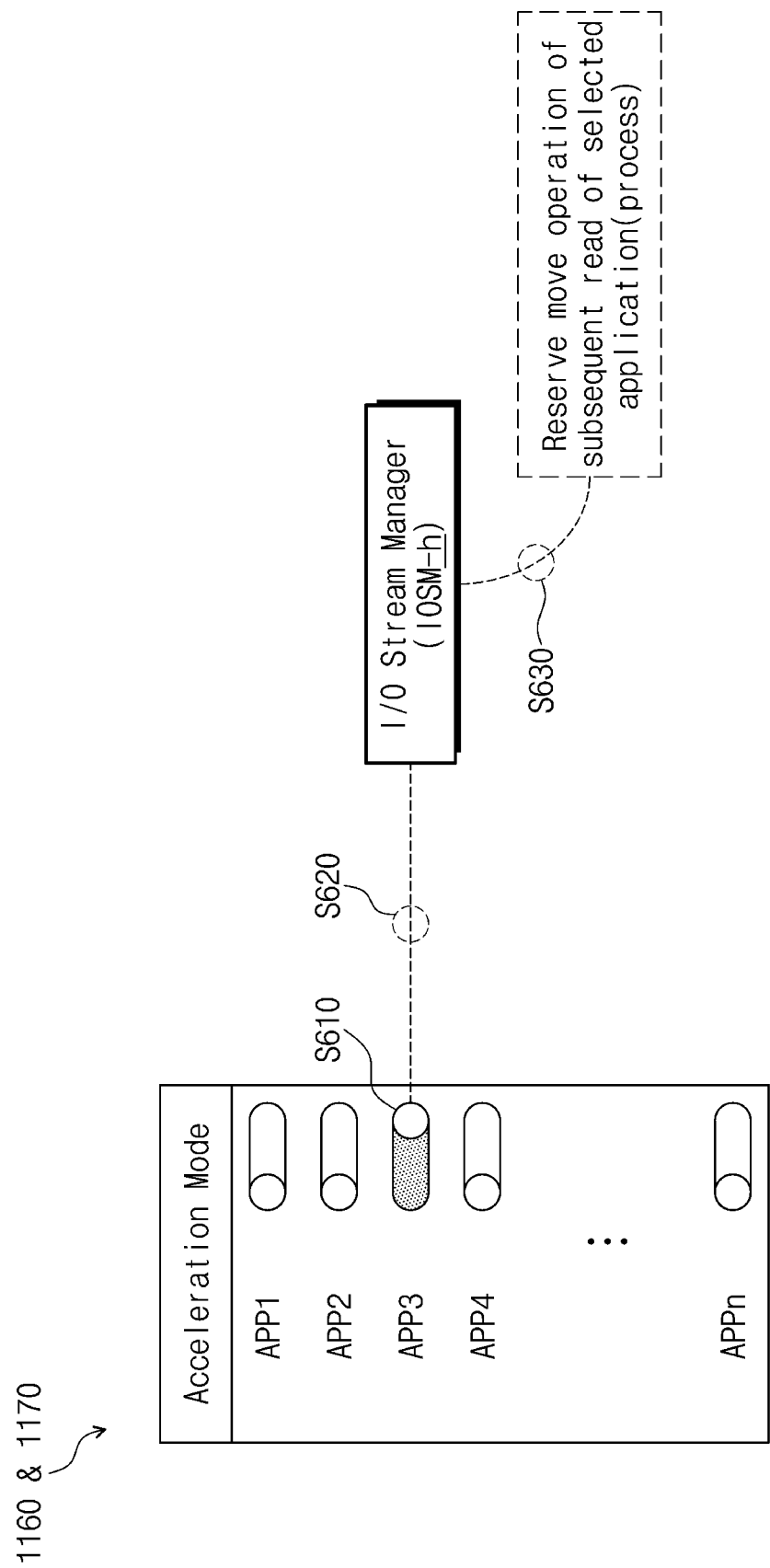
FIG. 24 illustrates a conceptual diagram in which an embodiment of the inventive concept is applied to a storage system.

FIG. 24 illustrates a diagram in which an exemplary embodiment of the inventive concept is applied to the storage system 1000. Referring to FIGS. 23 and 24, the storage system 1000 may provide setting screens through the display 1160. One of the setting screens may provide information of an acceleration mode to the user.

The storage system 1000 may display a list of first to n-th applications APP1 to APPn, to which the acceleration modes are applicable, through the display 1160. In addition, the storage system 1000 may display, through the display 1160, switches that allow the user to adjust the acceleration modes of the first to n-th applications APP1 to APPn.

In operation S1100, the user may touch an enable location of the acceleration mode of the third application APP3. The storage system 1000 may sense a touch of the user, in other words, the directions activating the third application APP3 through the touch panel 1170. In operation S1200, information of the third application APP3 or processes of the third application APP3 may be transferred to the I/O stream manager IOSM-h.

As the information of the third application APP3 or the processes of the third application APP3 are received, in operation S1300, the I/O stream manager IOSM-h may reserve a move operation of a subsequent read of the third application APP3 or the processes thus selected. For example, the I/O stream manager IOSM-h may set the move attributes MA with respect to data associated with the third application APP3 through the query request UPIU and may include a move flag as the move information MV in the CMD UPIU when a read operation associated with the third application APP3 is required.

As another example, the I/O stream manager IOSM-h may include a move flag and the move attributes MA as the move information MV in the CMD UPIU when a read operation associated with the third application APP3 is required. For example, the I/O stream manager IOSM-h may specify the pinned turbo write buffer TWB-p or the non-pinned turbo write buffer TWB-np as the destination information DST of the move attributes MA.

When the data associated with the third application APP3 are moved to the pinned turbo write buffer TWB-p or the non-pinned turbo write buffer TWB-np, an operation of reading the data associated with the third application APP3 is accelerated. Accordingly, the performance of the third application APP3 may be accelerated.

For example, in a case where the acceleration mode of the third application APP3 is disabled, the I/O stream manager IOSM-h may reserve the move operation of the third application APP3, for example, the move operation to the user storage UST or the non-pinned turbo write buffer TWB-np.

In the above embodiments, the inventive concept is described with reference to the UFS protocol. However, the inventive concept is not limited to the UFS protocol and may be applied to various protocols.

In the above-described embodiments, components of the storage system 1000 are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit, an application-specific IC (ASCI), a field-programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, a storage device provides a turbo write buffer supporting faster write and read than user storage. The storage device supports a preferred write on the turbo write buffer and supports to move data of the user storage to the turbo write buffer. Accordingly, the storage device with increased write and read speeds is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An operating method of a Universal Flash Storage (UFS) device, the method comprising:
   receiving, by the UFS device from a host, a first query request for reading a device descriptor, wherein the UFS device comprises a nonvolatile memory device and a memory controller, the nonvolatile memory device including a turbo write buffer area and a user storage area, the turbo write buffer area including a pinned turbo write buffer area and a non-pinned turbo write buffer area;
   transferring, by the UFS device, a first query response including the device descriptor to the host, wherein the device descriptor has information about whether to support a turbo write function and a move operation, and the information is included in an extended UFS function support field of the device descriptor;
   receiving, by the UFS device, a second query request for setting a value of a first flag indicating whether the turbo write function is enabled or disabled;
   transferring, by the UFS device, a second query response;
   receiving, by the UFS device, a third query request for setting a value of a second flag indicating whether a flush function is enabled or disabled, wherein the second flag comprises a first field indicating whether the flush function is enabled in an idle state of the UFS device and a second field indicating whether the flush function is enabled in a hibernation state of the UFS device;
   transferring, by the UFS device, a third query response;
   receiving, by the UFS device from the host, a first UFS protocol information unit (UPIU) including a write command with a logical block address and area information, and data,
   storing, by the UFS device, the data in one area of the pinned turbo write buffer area or the non-pinned turbo write buffer area when the turbo write function is enabled, and in the user storage area when the turbo write function is not enabled;
   receiving, by the UFS device from the host, a second UPIU including a move information defined by an UFS protocol; and
   moving a target data stored in the non-pinned turbo write buffer area, the pinned turbo write buffer area or the user storage area to one area among the non-pinned turbo write buffer area, the pinned turbo write buffer area or the user storage area through the move information in response to the second UPIU, wherein the target data is moved to the non-pinned turbo write buffer area or the pinned turbo write buffer area when the host requests a function of accelerating a read speed of the target data,
   wherein a storage space of the UFS device is managed through a plurality of logical units which corresponds to a physical storage of the nonvolatile memory device and wherein the turbo write buffer area is configured in at least one of the plurality of logical units, and
   wherein the pinned turbo write buffer area and the non-pinned turbo write buffer area are accessible based on the first UPIU including the write command when the value of the first flag indicates that the turbo write function is enabled,
   wherein second data stored in the non-pinned turbo write buffer area is flushed to the user storage area in the idle state or the hibernation state based on the value of the second flag.

2. The method of claim 1, wherein the information about whether to support the turbo write function is set to a particular bit of the extended UFS function support field.

3. The method of claim 1, wherein the device descriptor includes a shared turbo write buffer allocation number field including information about a size of the turbo write buffer area.

4. The method of claim 1 further comprising:
   storing the data in the user storage area when a space of the turbo write buffer area is insufficient while the turbo write function is enabled.

5. The method of claim 1, wherein the device descriptor includes a turbo write buffer capacity adjustment factor field indicating information about a capacity reduction factor according to a kind of turbo write buffer memory.

6. The method of claim 1 further comprising:
   updating a physical address of the second data while a logical address of the second data is maintained after the second data is flushed to the user storage area.

7. The method of claim 6 further comprising:
   periodically performing a flush operation to move the second data to the user storage area.

8. The method of claim 6 further comprising:
   flushing all data present in the non-pinned turbo write buffer area to the user storage area before any data of the pinned turbo write buffer area is flushed to the user storage area.

9. The method of claim 1 further comprising:
informing, by the UFS device, a remaining capacity of the turbo write buffer area in response to a request of the host.

10. A Universal Flash Storage (UFS) device comprising:
a nonvolatile memory device including a turbo buffer area divided into a pinned turbo write buffer area and a non-pinned turbo write buffer area, and a user storage area; and
a controller configured to:
receive a first query request for reading a device descriptor,
transfer a first query response including the device descriptor to a host, wherein the device descriptor has information about whether to support a turbo write function and a move operation, and wherein the information is included in an extended UFS function support field of the device descriptor,
receive a second query request for setting a value of a first flag indicating whether the turbo write function is enabled or disabled,
transfer a second query response,
receive a third query request for setting a value of a second flag indicating whether a flush function is enabled or disabled, wherein the second flag comprises a first field indicating whether the flush function is enabled in an idle state of the UFS device and a second field indicating whether the flush function is enabled in a hibernation state of the UFS device;
transfer a third query response;
receive a first UFS protocol information unit (UPIU) including a write command with a logical block address and area information, and data,
store the data in one area of the pinned turbo write buffer area or the non-pinned turbo write buffer area when the turbo write function is enabled, and in the user storage area when the turbo write function is not enabled;
receive a second UPIU including a move information defined by an UFS protocol; and
move a target data stored in the non-pinned turbo write buffer area, the pinned turbo write buffer area or the user storage area to one area among the non-pinned turbo write buffer area, the pinned turbo write buffer area or the user storage area through the move information in response to the second UPIU, wherein the target data is moved to the non-pinned buffer area or the pinned turbo write buffer area when the host requests a function of accelerating a read speed of the target data,
wherein a storage space of the UFS device is managed through a plurality of logical units which corresponds to a physical storage of the nonvolatile memory device, and
wherein a turbo write buffer area is configured in at least one of the plurality of logical units, and
wherein the pinned turbo write buffer area and the non-pinned turbo write buffer area are accessible based on the first UPIU including the write command when the value of the first flag indicates that the turbo write function is enabled, and
wherein second data stored in the non-pinned turbo write buffer area is flushed to the user storage area in the idle state or the hibernation state based on the value of the second flag.

11. The UFS device of claim 10, wherein the information about whether to support the turbo write function is set to a particular bit of the extended UFS function support field.

12. The UFS device of claim 10, wherein the device descriptor includes a shared turbo write buffer allocation number field including information about a size of the turbo write buffer area.

13. The UFS device of claim 10, wherein the controller is configured to write the data in the user storage area when a space of the turbo write buffer area is insufficient while the turbo write function is enabled.

14. The UFS device of claim 10, wherein the device descriptor includes a turbo write buffer capacity adjustment factor field indicating information about a capacity reduction factor according to a kind of turbo write buffer memory.

15. The UFS device of claim 10, wherein the controller is configured to update a physical address of the second data while a logical address of the second data is maintained after the second data is flushed to the user storage area.

16. The UFS device of claim 15, wherein the controller is configured to periodically perform a flush operation to move the second data from the turbo write buffer area to the user storage area.

17. The UFS device of claim 10, wherein data present in the non-pinned turbo write buffer area is first flushed to the user storage area before any data of the pinned turbo write buffer area is flushed to the user storage area.

18. An operating method of a Universal Flash Storage (UFS) device, the method comprising:
receiving, by the UFS device from a host, a first query request for reading a device descriptor from the UFS device, wherein the UFS device is configured in a nonvolatile memory device, the nonvolatile memory device including a turbo write buffer area and a user storage area, the turbo write buffer area including a pinned turbo write buffer area and a non-pinned turbo write buffer area, wherein the nonvolatile memory device is configured to migrate first data from the non-pinned turbo write buffer area to the user storage area during a first period of a migration operation and to migrate second data from the pinned turbo-write buffer area to the user storage area during a second period of the same migration operation following the first period;
transferring, by the UFS device, a query response including the device descriptor to the host, wherein the device descriptor has information about whether to support a turbo write function and a move operation, and the information is included in an extended UFS function support field of the device descriptor;
receiving, by the UFS device, a second query request for setting a value of a first flag indicating whether the turbo write function is enabled or disabled;
transferring, by the UFS device, a second query response;
receiving, by the UFS device, a third query request for setting a value of a second flag indicating whether a flush function is enabled or disabled, wherein the second flag comprises a first field indicating whether the flush function is enabled in an idle state of the UFS device and a second field indicating whether the flush function is enabled in a hibernation state of the UFS device;
transferring, by the UFS device, a third query response;
receiving, by the UFS device from the host, a first UFS protocol information unit (UPIU) including a write command with a logical block address and area information, and data,
storing, by the UFS device, the data in one area of the pinned turbo write buffer area or the non-pinned turbo write buffer area when the turbo write function is enabled, and in the user storage area when the turbo write function is not enabled;

receiving, by the UFS device from the host, a second UPIU including a move information defined by an UFS protocol; and moving a target data stored in the non-pinned turbo write buffer area, the pinned turbo write buffer area or the user storage area to one area among the non-pinned turbo write buffer area, the pinned turbo write buffer area or the user storage area through the move information in response to the second UPIU, wherein the target data is moved to the non-pinned turbo write buffer area or the pinned turbo write buffer area when the host requests a function of accelerating a read speed of the target data, wherein a storage space of the UFS device is managed through a plurality of logical units which corresponds to a physical storage of the nonvolatile memory device and wherein the turbo write buffer area is configured in at least one of the plurality of logical units.

* * * * *